United States Patent
Ryu et al.

(10) Patent No.: US 12,433,064 B2
(45) Date of Patent: Sep. 30, 2025

(54) INKJET PRINTING DEVICE, METHOD FOR ALIGNING BIPOLAR ELEMENT, AND METHOD FOR MANUFACTURING DISPLAY DEVICE

(71) Applicant: Samsung Display Co., LTD., Yongin-si (KR)

(72) Inventors: An Na Ryu, Hwaseong-si (KR); Jin Oh Kwag, Yongin-si (KR); Sung Hoon Kim, Seoul (KR); Dong Ho Lee, Seoul (KR); Sung Chan Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 922 days.

(21) Appl. No.: 17/628,981

(22) PCT Filed: Feb. 27, 2020

(86) PCT No.: PCT/KR2020/002798
§ 371 (c)(1),
(2) Date: Jun. 14, 2022

(87) PCT Pub. No.: WO2021/015385
PCT Pub. Date: Jan. 28, 2021

(65) Prior Publication Data
US 2022/0320365 A1    Oct. 6, 2022

(30) Foreign Application Priority Data
Jul. 24, 2019   (KR) .......................... 10-2019-0089752

(51) Int. Cl.
*H10H 20/01*   (2025.01)
*B41J 2/06*    (2006.01)
(Continued)

(52) U.S. Cl.
CPC ............... *H10H 20/01* (2025.01); *B41J 2/06* (2013.01); *H10H 20/821* (2025.01); *H10H 20/84* (2025.01); *H10H 29/142* (2025.01)

(58) Field of Classification Search
CPC ...... H10H 20/01; H10H 20/821; H10H 20/84; H10H 29/142; B41J 2/06; B41J 2/1433;
(Continued)

(56) References Cited

U.S. PATENT DOCUMENTS 5,144,340 A *  9/1992  Hotomi ...................... B41J 2/06
                                                        347/55
6,089,700 A *  7/2000  Ahn ....................... B41J 2/14129
                                                        347/61

(Continued)

FOREIGN PATENT DOCUMENTS

EP       1503431       2/2005
EP       2 740 602     6/2014
(Continued)

OTHER PUBLICATIONS

International Search Report, with English translation, corresponding to International Application No. PCT/KR2020/002798 dated Jun. 16, 2020.

(Continued)

*Primary Examiner* — Jason S Uhlenhake
*Assistant Examiner* — Alexander D Shenderov
(74) *Attorney, Agent, or Firm* — Womble Bond Dickinson (US) LLP

(57) ABSTRACT

Provided are an inkjet printing device, a method for aligning a bipolar element, and a method for manufacturing a display device. The inkjet printing device is for ejecting ink and includes a bipolar element extending in one direction. The inkjet printing device comprises: an electric field generation unit which includes a stage and a probe unit for generating (Continued)

an electric field on the stage; and an inkjet head which is positioned above the stage and includes a plurality of nozzles through which the ink is ejected, wherein the nozzles includes an inlet having a first diameter and an outlet connected to the inlet and having a second diameter smaller than the first diameter.

27 Claims, 31 Drawing Sheets

(51) Int. Cl.
 *H10H 20/821* (2025.01)
 *H10H 20/84* (2025.01)
 *H10H 29/14* (2025.01)
(58) Field of Classification Search
 CPC .......... B41J 2002/14475; B41J 2202/09; B41J 2/095; B41J 2/14072; B41J 2/085
 USPC .......................................................... 347/55
 See application file for complete search history.

(56) References Cited

U.S. PATENT DOCUMENTS

| | | |
|---|---|---|
| 6,312,110 B1 | 11/2001 | Darty |
| 2005/0023539 A1 | 2/2005 | Fujiwara et al. |
| 2007/0195152 A1* | 8/2007 | Kawai .................... B41J 2/185 347/112 |
| 2015/0138626 A1 | 5/2015 | Kwon et al. |
| 2018/0019377 A1* | 1/2018 | Kim ................ H10H 20/01335 |
| 2018/0138157 A1* | 5/2018 | Im ..................... H10H 20/8314 |
| 2019/0296200 A1 | 9/2019 | Im et al. |
| 2020/0203583 A1 | 6/2020 | Im et al. |
| 2021/0193885 A1 | 6/2021 | Im et al. |

FOREIGN PATENT DOCUMENTS

| | | |
|---|---|---|
| JP | 2834104 | 12/1998 |
| JP | 2001-129999 | 5/2001 |
| JP | 2005-342961 | 12/2005 |
| KR | 10-2006-0100600 | 9/2006 |
| KR | 10-1000715 | 12/2010 |
| KR | 10-2011-0082969 | 7/2011 |
| KR | 10-2012-0122159 | 11/2012 |
| KR | 10-2013-0122551 | 11/2013 |
| KR | 10-2014-0073204 | 6/2014 |
| KR | 10-1482951 | 1/2015 |
| KR | 10-2016-0059576 | 5/2016 |
| KR | 10-2016-0073837 | 6/2016 |
| KR | 10-2017-0053511 | 5/2017 |
| KR | 10-2017-0124946 | 11/2017 |
| KR | 10-2017-0141305 | 12/2017 |
| KR | 10-2018-0055021 | 5/2018 |

OTHER PUBLICATIONS

Written Opinion, with English translation, corresponding to International Application No. PCT/KR2020/002798, dated Jun. 16, 2020.

Extended European Search Report for European Application No. 20843237.7, dated Jun. 22, 2023.

* cited by examiner

FIG. 7
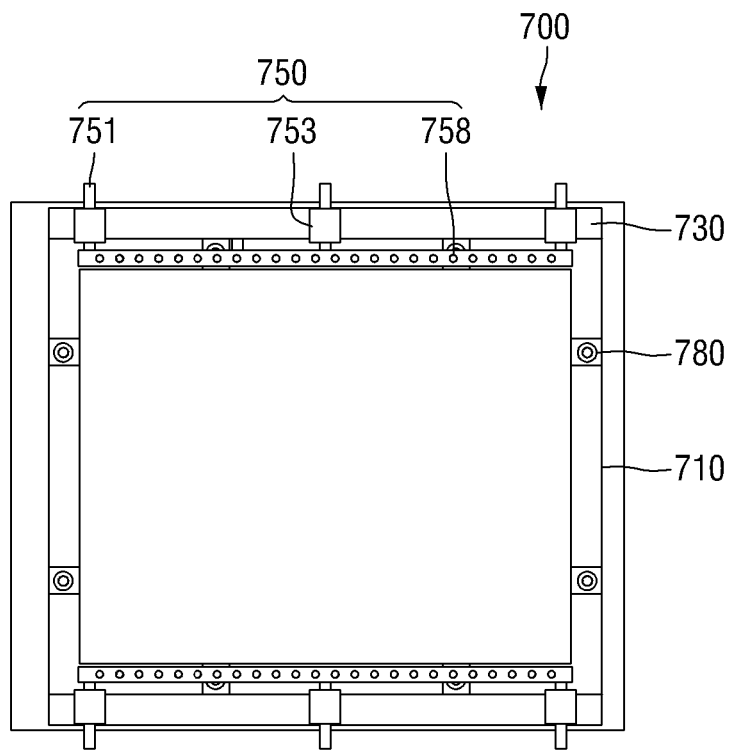
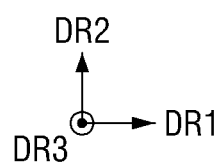

FIG. 20
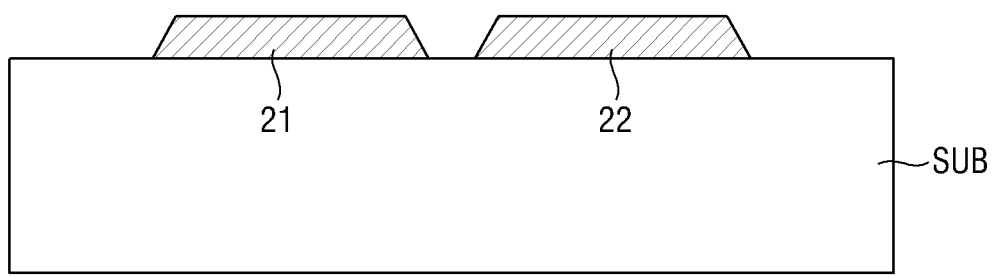
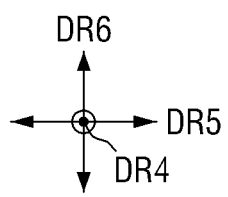

FIG. 21
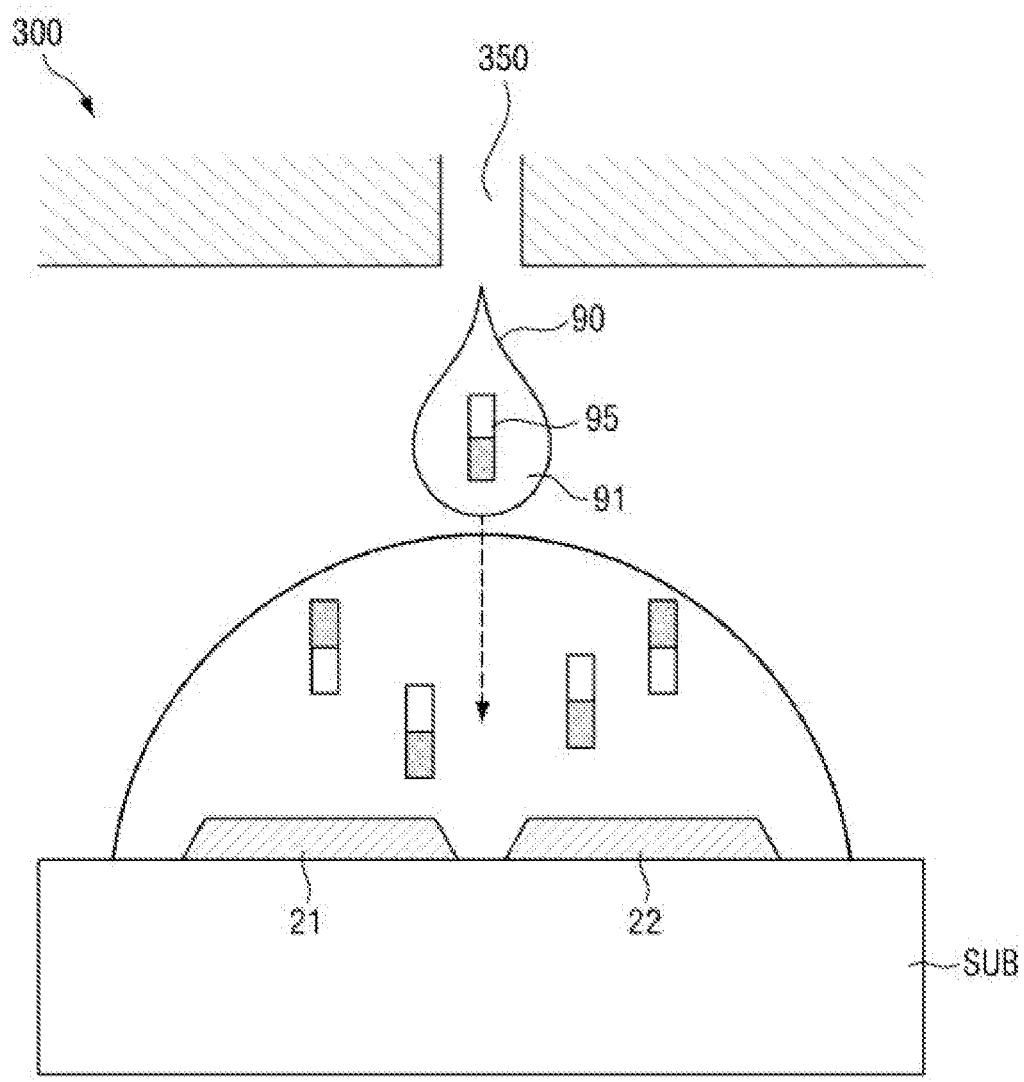
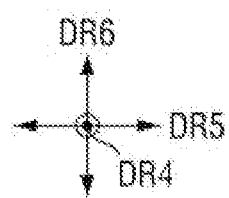

FIG. 23
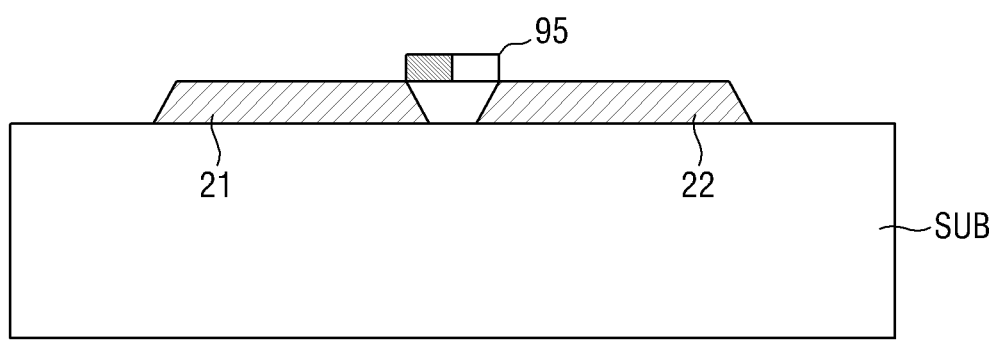
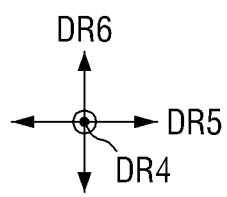

INKJET PRINTING DEVICE, METHOD FOR ALIGNING BIPOLAR ELEMENT, AND METHOD FOR MANUFACTURING DISPLAY DEVICE

CROSS-REFERENCE TO RELATED APPLICATION(S)

This application is a national entry of International Application No. PCT/KR2020/002798, filed on Feb. 27, 2020, which claims under 35 U.S.C. §§ 119(a) and 365(b) priority to and benefits of Korean Patent Application No. 10-2019-0089752, filed on Jul. 24, 2019, in the Korean Intellectual Property Office (KIPO), the entire contents of which are incorporated herein by reference.

BACKGROUND

1. Technical Field

The disclosure relates to an inkjet printing device, a method for aligning a bipolar element, and a method for manufacturing a display device.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

An inorganic light emitting diode using an inorganic semiconductor as a fluorescent material has an advantage in that it has durability even in a high temperature environment, and has higher efficiency of blue light than an organic light emitting diode. Also, in the manufacturing process, as noted as a drawback of a conventional inorganic light emitting diode, a transfer method using a dielectrophoresis (DEP) method has been developed. Accordingly, continuous studies have been conducted on the inorganic light emitting diode having superior durability and efficiency compared to the organic light emitting diode.

Meanwhile, an inkjet printing device may be used to transfer an inorganic light emitting diode element using a dielectrophoresis method or to form an organic material layer included in a display device. After an arbitrary ink or solution is inkjet-printed, a post-treatment process may be executed to transfer the inorganic light emitting diode element or to form the organic material layer. The inkjet printing device may execute a process of supplying a predetermined ink or solution to an inkjet head and spraying the ink or the solution onto a predetermined substrate using the inkjet head.

SUMMARY

Aspects of the disclosure provide an inkjet printing device in which a bipolar element may be ejected with a predetermined orientation.

Aspects of the disclosure also provide a method for aligning a bipolar element with an improved alignment degree by using an inkjet printing device, and a method for manufacturing a display device including the bipolar element.

It should be noted that aspects of the disclosure are not limited thereto and other aspects, which are not mentioned herein, will be apparent to those of ordinary skill in the art from the following description.

According to an embodiment of the disclosure, an inkjet printing device may include an electric field generation part including a stage, and a probe part generating an electric field on the stage, and an inkjet head positioned above the stage and including nozzles from which ink is ejected. Each of the nozzles may include an inlet having a first diameter, and an outlet connected to the inlet and having a second diameter smaller than the first diameter. The inkjet printing device may eject the ink including a bipolar element extending in an extension direction.

Each of the nozzles may include a first side surface which is a side surface of the outlet, may extend in a first direction, and a second side surface which is a side surface of the inlet, may be inclined with respect to the first direction.

The ink may be introduced into the outlet through the inlet, and the bipolar element may be introduced into the outlet along the second side surface of each of the nozzles.

The bipolar element may be ejected from the outlet in a state in which the extension direction of the bipolar element is parallel to the first direction.

The inkjet head may further include a guide part positioned between the nozzles, and the guide part may include a first guide part between the outlets, and a second guide part between the inlets.

The inkjet head may further include an electric field generation electrode disposed in the guide part.

The electric field generation electrode may include a first electric field generation electrode disposed on a surface of the first guide part contacting the first side surface, and a second electric field generation electrode disposed on a surface of the second guide part contacting the second side surface and spaced apart from the first electric field generation electrode in the first direction.

The first electric field generation electrode and the second electric field generation electrode may generate an electric field in the first direction at the inlet and the outlet.

The inkjet head may further include an electric field generation coil disposed to surround the nozzles.

The electric field generation coil may generate an electric field in the first direction at the inlet and the outlet.

The inkjet head may further include an inner tube connected to the inlet, and a first diameter of the inlet may decrease from the inner tube to the outlet.

The inkjet head may further include a plurality of third guide parts disposed between the inlet and the inner tube, and each of the nozzles may further include an inlet tube formed by a separation space between the third guide parts between the inner tube and the inlet.

The ink may be supplied from the inner tube to the inlet along the inlet tube, and the bipolar element may be introduced to the second side surface along a side surface of the inlet tube.

The inkjet head may be disposed on a print head part mounted on a support extending in a direction, and the print head part may move in the direction.

The ejected ink may be sprayed onto the stage, and the electric field generation part may generate an electric field on the stage.

The bipolar element sprayed onto the stage may be aligned by the electric field such that the extension direction of the bipolar element faces a second direction different from the first direction.

According to an embodiment of the disclosure, a method for aligning a bipolar element may include spraying ink including a bipolar element oriented in an extension direction onto a target substrate, and generating an electric field above the target substrate to place the bipolar element on the target substrate.

The bipolar element may have a shape extending in the extension direction of the bipolar element, and the spraying of the ink may be performed in a state in which an orientation direction of a long axis of the bipolar element is perpendicular to a top surface of the target substrate.

The spraying of the ink may comprise generating an electric field in the ink such that the long axis of the bipolar element is oriented in a direction that the electric field faces.

The ink may be sprayed in a state in which an end of the bipolar element is oriented toward the top surface of the target substrate.

The target substrate may include a first electrode and a second electrode, and the placing of the bipolar element may comprise placing the bipolar element between the first electrode and the second electrode.

At least one end of the bipolar element may be disposed on at least one of the first electrode or the second electrode.

The spraying of the ink onto the target substrate may be performed using an inkjet printing device.

The inkjet printing device may include an electric field generation part including a stage, and a probe part generating an electric field on the stage; and an inkjet head positioned above the stage and including nozzles from which the ink is ejected, and each of the nozzles may include an inlet having a first width, and an outlet connected to the inlet and having a second width smaller than the first width.

According to an embodiment of the disclosure, a method for manufacturing a display device may include preparing a target substrate on which a first electrode and a second electrode are formed, spraying ink including a light emitting element oriented in a direction onto the target substrate, and placing the light emitting element between the first electrode and the second electrode.

The bipolar element may have a shape extending in an extension direction, and the spraying of the ink may be performed in a state in which an orientation direction of a long axis of the light emitting element is perpendicular to a top surface of the target substrate.

The placing of the bipolar element may further include generating an electric field on the first electrode and the second electrode, and the method may further include aligning the orientation direction of the long axis of the light emitting element by the electric field.

The details of other embodiments are included in the detailed description and the accompanying drawings.

An inkjet printing device according to an embodiment may include nozzles that have an inclined side surface and different diameters in some regions, and bipolar elements dispersed in the ink may be ejected in a state having an arbitrary orientation direction. In addition, in the inkjet printing device, members capable of generating an electric field may be further disposed in the inkjet head, and the bipolar element may be ejected in an aligned state having a specific orientation direction.

Accordingly, the bipolar elements may be aligned with a high alignment degree using the inkjet printing device according to an embodiment.

The effects according to the embodiments are not limited by the contents exemplified above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 7 is a schematic plan view of an electric field generation part according to an embodiment.

FIGS. 20 to 23 are schematic cross-sectional views illustrating a method for aligning a bipolar element by using an inkjet printing device according to an embodiment.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
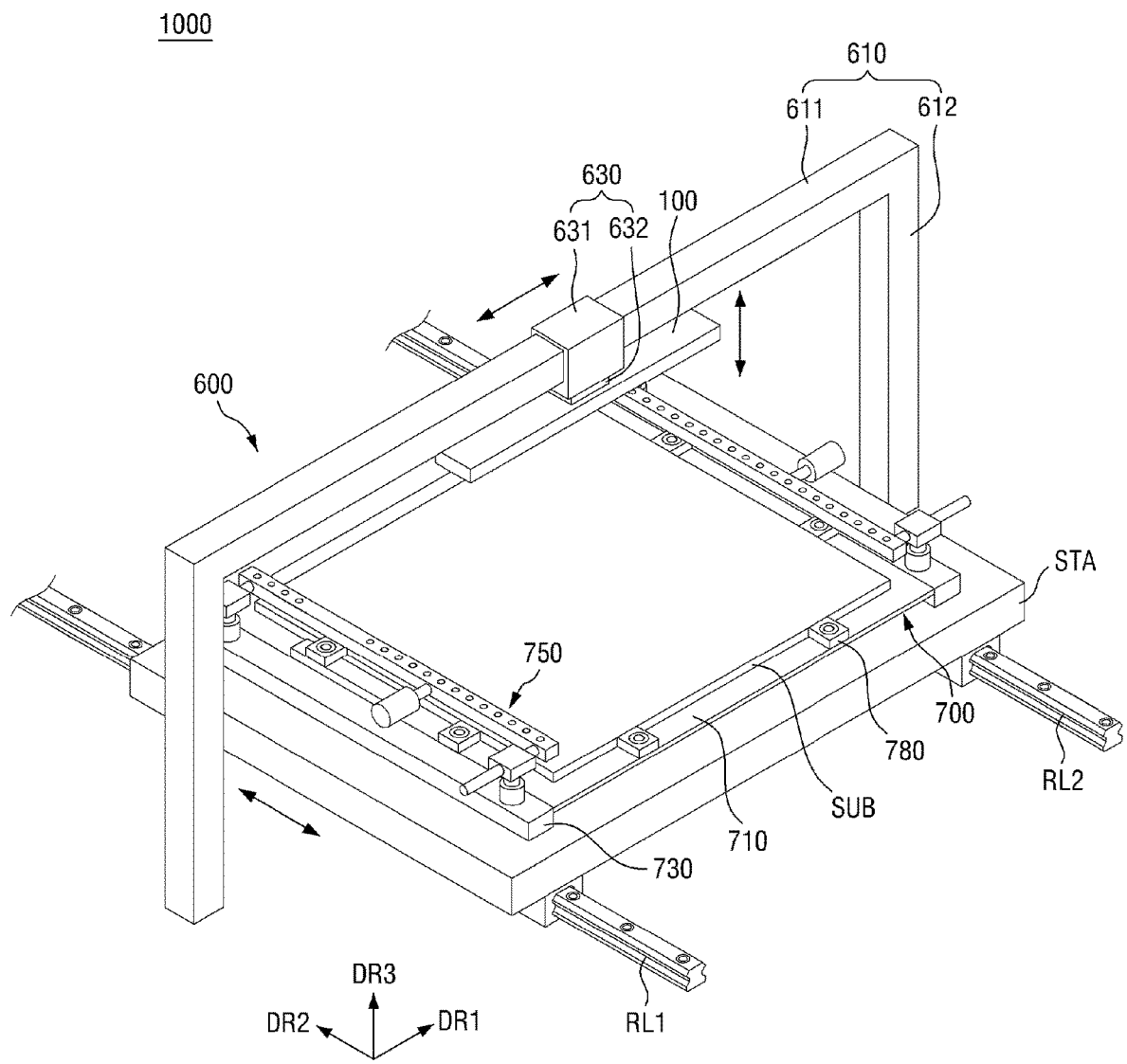
FIG. 1 is a schematic perspective view of an inkjet printing device according to an embodiment.

FIG. 1 is a schematic perspective view of an inkjet printing device according to an embodiment.

Referring to FIG. 1, an inkjet printing device 1000 according to an embodiment includes a print head part 100 including inkjet heads 300 (see FIG. 2) and an electric field generation part 700. The inkjet printing device 1000 may further include a base frame 600 and a stage STA.

The inkjet printing device 1000 may spray an ink 90 (see FIG. 3) onto a target substrate SUB (see FIG. 3) by using the print head part 100. An electric field may be generated by the electric field generation part 700 on the target substrate SUB onto which the ink 90 is sprayed, and particles such as bipolar elements included in the ink 90 may be aligned on the target substrate SUB.

The target substrate SUB may be provided on the electric field generation part 700, the electric field generation part 700 may form an electric field above the target substrate SUB, and the electric field may be transferred to the ink 90 sprayed on the target substrate SUB. Particles such as bipolar elements included in the ink 90 may extend in a direction, and may be aligned such that the extension direction faces a direction by the electric field. Here, the inkjet printing device 1000 according to an embodiment may include the inkjet head 300 to be described below, such that particles such as bipolar elements to be aligned on the target substrate SUB may be sprayed onto the target substrate SUB in a state of being oriented in an arbitrary direction. The inkjet head 300 may prevent a nozzle 350 from which the ink 90 is ejected from being clogged by the particles included in the ink 90. Hereinafter, the inkjet printing device 1000 will be described in detail with reference to the drawings.

As illustrated in FIG. 1, a first direction DR1, a second direction DR2, and a third direction DR3 are defined. The first direction DR1 and the second direction DR2 are located on a plane and are orthogonal to each other, and the third direction DR3 is a direction perpendicular to the first direction DR1 and the second direction DR2. It may be understood that the first direction DR1 refers to a horizontal direction in the drawing, the second direction DR2 refers to a vertical direction in the drawing, and the third direction DR3 refers to an upward and downward direction in the drawing.

Figure 2:
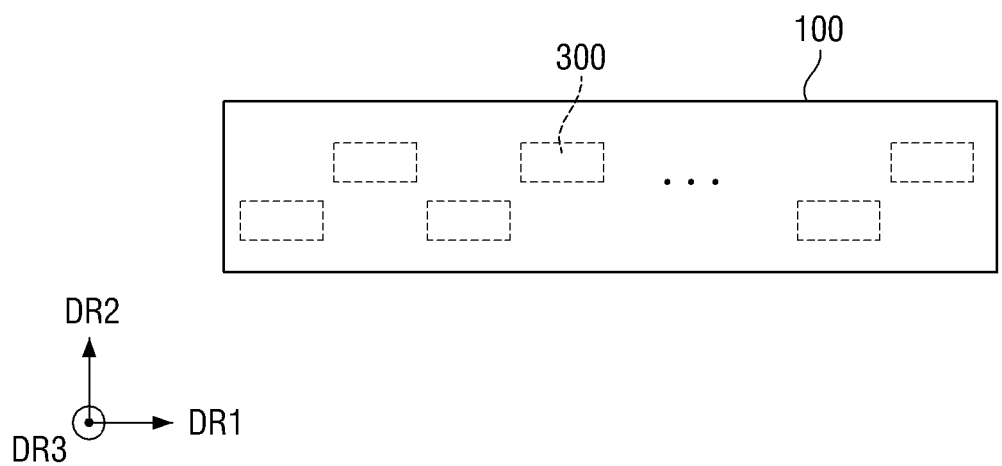
FIG. 2 is a schematic plan view of a print head part according to an embodiment.

FIG. 2 is a schematic plan view of a print head part according to an embodiment.

Referring to FIGS. 1 and 2, the inkjet printing device 1000 includes the print head part 100 including the inkjet heads 300 and the electric field generation part 700. The inkjet printing device 1000 may further include the stage STA on which the electric field generation part 700 is disposed.

The stage STA may provide a portion in which the electric field generation part 700 is disposed. The inkjet printing device 1000 includes a first rail RL1 and a second rail RL2 extending in the second direction DR2, and the stage STA is disposed on the first rail RL1 and the second rail RL2. The stage STA may move on the first rail RL1 and the second rail RL2 in the second direction DR2 by a separate moving member. The electric field generation part 700 may move together with the stage STA in the second direction DR2, and the ink 90 may be sprayed above the electric field generation part 700 while the electric field generation part 700 passes by the print head part 100.

The print head part 100 may include the inkjet heads 300 and may be disposed on the base frame 600. The print head part 100 may spray the ink 90 onto the target substrate SUB provided on the electric field generation part 700 by using the inkjet head 300 connected to a separate ink storage part.

In an embodiment, the ink 90 may include a solvent 91 and bipolar elements 95 included in the solvent 91. In an embodiment, the ink 90 may be provided in a solution or colloidal state. For example, the solvent 91 may be acetone, water, alcohol, toluene, propylene glycol (PG), propylene glycol methyl acetate (PGMA), or the like, but the disclosure is not limited thereto. The bipolar elements 95 may be supplied to and ejected from the print head part 100 while being dispersed in the solvent 91.

The base frame 600 may include a support part 610 and a moving part 630. The support part 610 may include a first support part 611 extending in the first direction DR1, which is the horizontal direction, and a second support part 612 connected to the first support part 611 and extending in the third direction DR3, which is the vertical direction. The extension direction of the first support part 611 may be the same as the first direction DR1 which is a long-side direction of the electric field generation part 700. The print head part 100 may be disposed on the moving part 630 mounted on the first support part 611.

The moving part 630 may include a moving part 631 which is mounted on the first support part 611 and movable in a direction and a fixing part 632 which is disposed on the bottom surface of the moving part 631 and on which the print head part 100 is placed. The moving part 631 may move in the first direction DR1 on the first support part 611, and the print head part 100 may be fixed to the fixing part 632 to move together with the moving part 631 in the first direction DR1.

The print head part 100 may be disposed on the base frame 600 and may spray the ink 90 provided from an ink reservoir onto the target substrate SUB through the inkjet head 300 to be described below. The print head part 100 may be spaced apart from the stage STA passing below the base frame 600 by a predetermined distance. The distance between the print head part 100 and the stage STA may be adjusted by the height of the second support part 612 of the base frame 600. The distance between the print head part 100 and the stage STA may be adjusted within a range in which a process space can be secured due to a distance between the print head part 100 and the target substrate SUB in case that the electric field generation part 700 and the target substrate SUB are disposed on the stage STA.

According to an embodiment, the print head part 100 may include the inkjet head 300 including nozzles 350. The inkjet head 300 may be disposed on the bottom surface of the print head part 100.

The inkjet heads 300 may be disposed to be spaced apart from each other in a direction and may be arranged in a row or rows. The drawing illustrates that the inkjet heads 300 are disposed in two rows and the inkjet heads 300 of each row are alternately disposed. However, the disclosure is not limited thereto, and the inkjet heads 300 may be arranged in a larger number of rows and may be disposed to overlap each other without intersecting each other. The shape of the inkjet head 300 is not particularly limited, but as an example, the inkjet head 300 may have a quadrilateral shape.

At least one inkjet head 300, for example, two inkjet heads 300, may form a pack to be disposed adjacent to each other. However, the number of inkjet heads 300 included in a pack is not limited thereto, and for example, the number of inkjet heads 300 included in a pack may be one to five. Although the drawing illustrates only six inkjet heads 300 disposed in the print head part 100, this is to schematically illustrate the print head part 100, and the number of inkjet heads 300 is not limited thereto.

The inkjet head 300 disposed in the print head part 100 may spray the ink 90 onto the target substrate SUB disposed above the stage STA. According to an embodiment, the print head part 100 may move on the first support part 611 in a direction, and the inkjet head 300 may move in the direction to spray the ink 90 onto the target substrate SUB.

Figure 3:
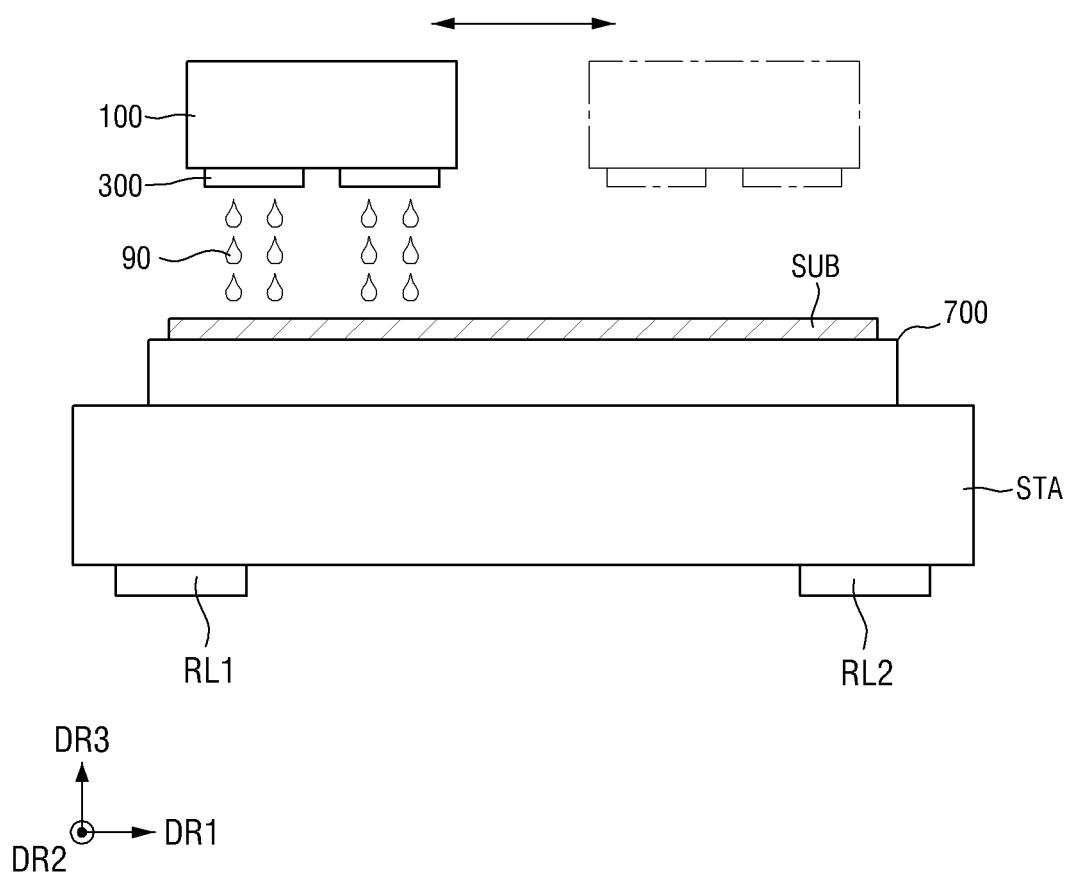
FIG. 3 is a schematic view illustrating an operation of a print head part according to an embodiment.

FIG. 3 is a schematic view illustrating an operation of a print head part according to an embodiment. FIG. 3 illustrates a front view of the print head part 100 and the electric field generation part 700 disposed on the stage STA according to an embodiment.

Referring to FIGS. 1 and 3, the print head part 100 may move in the first direction DR1 in which the first support part 611 extends, and the inkjet head 300 may move in the first direction DR1 and spray the ink 90 onto the target substrate SUB. In some embodiments, a width of the target substrate SUB measured in the first direction DR1 may be greater than a width of the print head part 100. In this case, the print head part 100 may move in the first direction DR1 and spray the ink 90 over the entire surface of the target substrate SUB. In case that target substrates SUB are provided on the electric field generation part 700, the print head part 100 may spray the ink 90 onto each of the target substrates SUB while moving in the first direction DR1.

However, the disclosure is not limited thereto, and the print head part 100 may be positioned outside of the first rail RL1 and the second rail RL2 and move in the first direction DR1 to spray the ink 90 onto the target substrate SUB. In case that the stage STA moves in the second direction DR2 and is positioned below the base frame 600, the print head part 100 may move between the first rail RL1 and the second rail RL2 to spray the ink 90 through the inkjet head 300. The operation of the inkjet head 300 is not limited thereto and may be modified in various ways within a range in which it can be implemented. A detailed description of the operation of the inkjet head 300 will be omitted.

Figure 4:
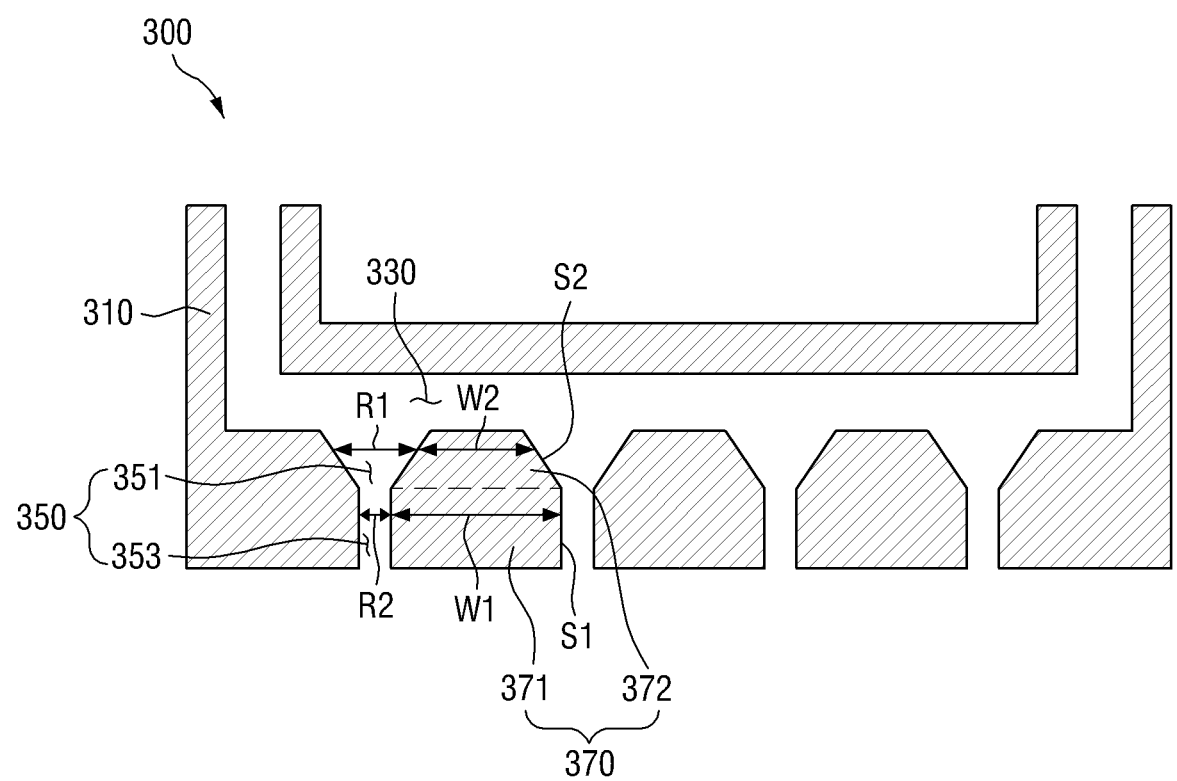
FIG. 4 is a schematic cross-sectional view of an inkjet head according to an embodiment.
Figure 5:
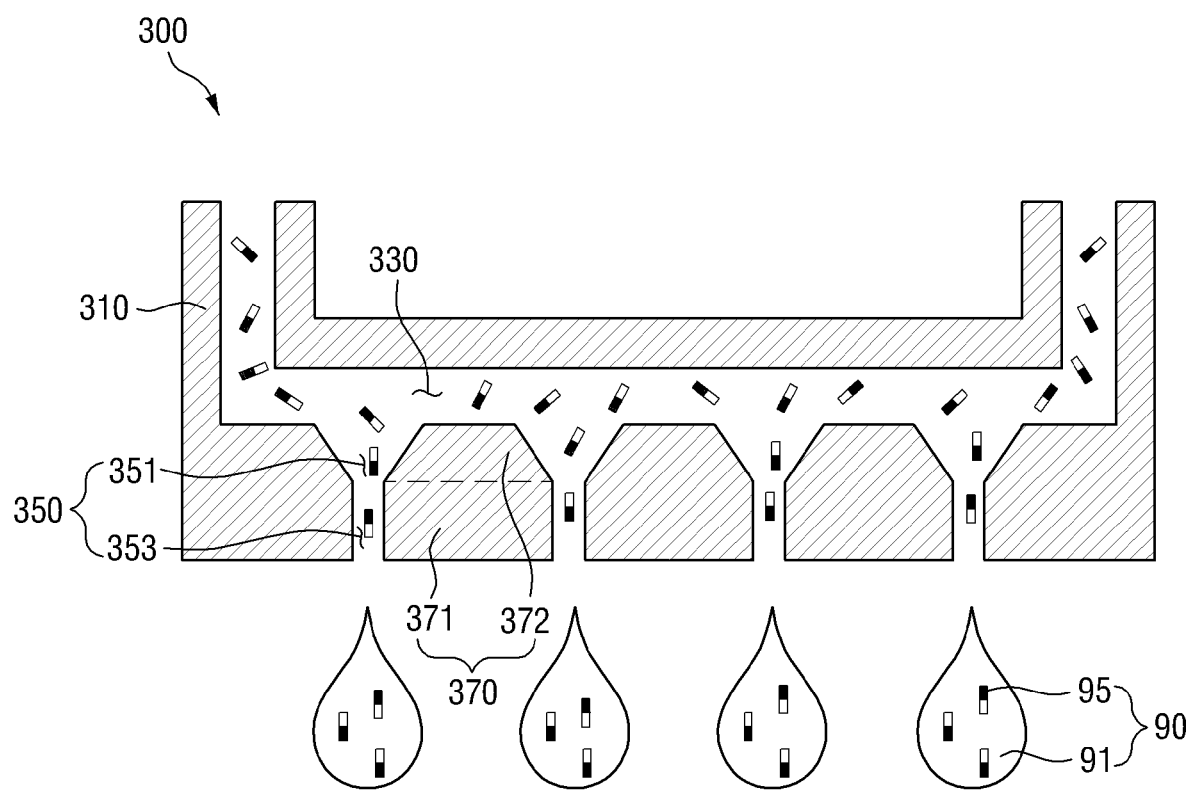
FIG. 5 is a cross-sectional view illustrating ink ejected from an inkjet head according to an embodiment.

FIG. 4 is a schematic cross-sectional view of an inkjet head according to an embodiment. FIG. 5 is a schematic cross-sectional view illustrating ink ejected from an inkjet head according to an embodiment.

Referring to FIGS. 4 and 5, the inkjet head 300 may include the nozzles 350 to eject the ink 90 through the nozzles 350. The ink 90 ejected from the nozzle 350 may be sprayed onto the target substrate SUB provided on the stage STA or the electric field generation part 700. The nozzles 350 may be positioned on the bottom surface of the inkjet head 300 and may be arranged in a direction in which the inkjet head 300 extends.

The inkjet head 300 according to an embodiment may include a base part 310, an inner tube 330 to which the ink 90 is supplied, nozzles 350 connected to the inner tube 330 to eject the ink 90, and a guide part 370 positioned between the nozzles 350 of the base part 310.

The base part 310 may be a portion forming (or constituting) a main body of the inkjet head 300. The base part 310 may be attached to the print head part 100, and the inner tube 330 included in the base part 310 may be connected to the inner flow path of the print head part 100 such that the ink 90 may be supplied thereto. The base part 310 may extend in a direction, and the inner tube 330 may be formed in the extension direction of the base part 310. The ink 90 supplied through the print head part 100 may be introduced along the inner tube 330 and may be ejected through the nozzle 350 of the inkjet head 300.

The inkjet head 300 may include the nozzles 350, and the base part 310 may include the guide part 370 between the nozzles 350. The nozzles 350 may be arranged to be spaced apart from each other, and a portion of the base part 310 between the nozzles 350 may be the guide part 370.

The nozzles 350 may be connected to the inner tube 330 and arranged in the extension direction of the base part 310. Although not illustrated in the drawings, the nozzles 350 may be arranged in a row or rows. In addition, although the drawing illustrates that four nozzles 350 are formed in the inkjet head 300, the disclosure is not limited thereto. In some embodiments, the number of nozzles 350 included in the inkjet head 300 may be in a range of about 128 to about 1800.

The nozzle 350 may eject the ink 90 introduced along the inner tube 330. The amount of the ink 90 sprayed through the nozzles 350 may be adjusted according to a voltage applied to each nozzle 350. In an embodiment, the amount of the ink 90 ejected once from each nozzle 350 may be about 1 to about 50 pico-liter (pL), but the disclosure is not limited thereto.

According to an embodiment, the nozzle 350 may include an inlet 351 having a first diameter R1 and an outlet 353 connected to the inlet 351 and having a second diameter R2 smaller than the first diameter R1. The inlet 351 is directly connected to the inner tube 330, and is a portion in which the ink 90 flowing along the inner tube 330 is supplied to the nozzle 350. The outlet 353 is connected to the inlet 351, and the ink 90 supplied from the inlet 351 may be ejected through the outlet 353.

The bipolar elements 95 dispersed in the ink 90 may extend in a direction. The bipolar elements 95 randomly dispersed in the ink 90 may flow along the inner tube 330 and may be supplied to the nozzle 350. In case that the entrance connected to the inner tube 330 of the nozzle 350 has a narrow diameter, the bipolar elements 95 in the ink 90 may be supplied to the nozzle 350 in a clustered state, and the entrance of the nozzle 350 may be clogged. The inkjet head 300 according to an embodiment may include the inlet 351 having the first diameter R1 that is larger than the second diameter R2 of the outlet 353, to prevent the nozzle 350 from being clogged by the bipolar elements 95. The first diameter R1 of the inlet 351 may be greater than the length of the long axis of the bipolar element 95, but the disclosure is not limited thereto.

As the bipolar element 95 extends in a direction, the orientation direction of the bipolar elements 95, which is a direction that the long axis faces, may be determined. The bipolar elements 95 may be supplied to the inner tube 330 while having random orientation directions in the ink 90. However, in case that the ink 90 flowing through the inner tube 330 is supplied to the nozzle 350, the direction that the long axis of the bipolar element 95 faces, for example, the orientation direction may be changed according to the shape of the inlet 351.

The nozzle 350 of the inkjet head 300 may have an inclined side surface in at least some regions. According to an embodiment, in the nozzle 350 of the inkjet head 300, a first side surface S1 that is a side surface of the outlet 353 may extend in a direction, and a second side surface S2 that is a side surface of the inlet 351 may be formed to be inclined with respect to the direction. The first diameter R1 of the inlet 351 may decrease from the inner tube 330 toward the outlet 353. The inlet 351 has a larger diameter than the outlet 353, and a portion of the inlet 351 adjacent to the outlet 353 has a smaller diameter than a portion thereof adjacent to the inner tube 330, so that the second side surface S2 may be formed to be inclined.

The ink 90 supplied from the inner tube 330 to the nozzle 350 may flow along the inclined side surface of the inlet 351. The bipolar elements 95 dispersed in the ink 90 flow along the second side surface S2 of the inlet 351, and as the bipolar elements 95 having random orientation directions flow along the second side surface S2, the orientation direction thereof may change. In the bipolar elements 95 extending in a direction, the direction of the long axis thereof may change in parallel with the inclined direction of the second side surface S2. Accordingly, the bipolar elements 95 dispersed in the ink 90 may have an orientation direction facing an arbitrary direction.

Unlike the inlet 351, in the outlet 353 of the nozzle 350, the first side surface S1 may extend in a direction. The ink 90 introduced through the inlet 351 may be ejected without changing the orientation direction while flowing along the first side surface S1 of the outlet 353. The bipolar elements 95 introduced into the outlet 353 may have an arbitrary orientation direction while flowing along the second side surface S2 of the inlet 351, and may be ejected from the outlet 353 while having the orientation direction. According to an embodiment, the bipolar element 95 ejected from the inkjet head 300 may be ejected in a state in which the direction of the long axis is parallel to a direction in which the first side surface S1 of the outlet 353 extends.

As illustrated in FIG. 5, the bipolar elements 95 supplied to the inner tube 330 flow with a random orientation direction. However, the bipolar elements 95 introduced into the outlet 353 through the inlet 351 of the nozzle 350 may be oriented such that a direction of extension (in which the bipolar elements 95 extend) is parallel to a direction in which the first side surface S1 extends. The ink 90 ejected from the nozzle 350 of the inkjet head 300 may include the bipolar elements 95 having an arbitrary orientation direction in a dispersed state.

The base part 310 of the inkjet head 300 may include the guide part 370, which is a portion positioned between the nozzles 350, and the shapes of the side surfaces S1 and S2 and the diameters R1 and R2 of the inlet 351 and the outlet 353 may be determined according to the shape of the guide part 370. According to an embodiment, the inkjet head 300 may include the guide part 370 positioned between the nozzles 350, and the guide part 370 may include a first guide part 371 between the outlets 353 and a second guide part 372 between the inlets 351. As described above, the first diameter R1 of the inlet 351 may be greater than the second diameter R2 of the outlet 353, and similarly, a first width W1 of the first guide part 371 may be greater than a second width W2 of the second guide part 372. The second width W2 of the second guide part 372 may increase from the inner tube 330 toward the first guide part 371. Accordingly, the first diameter R1 of the inlet 351 between the second guide parts 372 may be changed and may have an inclined side surface.

The nozzle 350 having the first side surface S1 and the second side surface S2 may eject the ink 90 in a state in which the bipolar elements 95 have an arbitrary orientation direction, and as described above, the ink 90 ejected from the inkjet head 300 may be sprayed onto the target substrate SUB.

Figure 6:
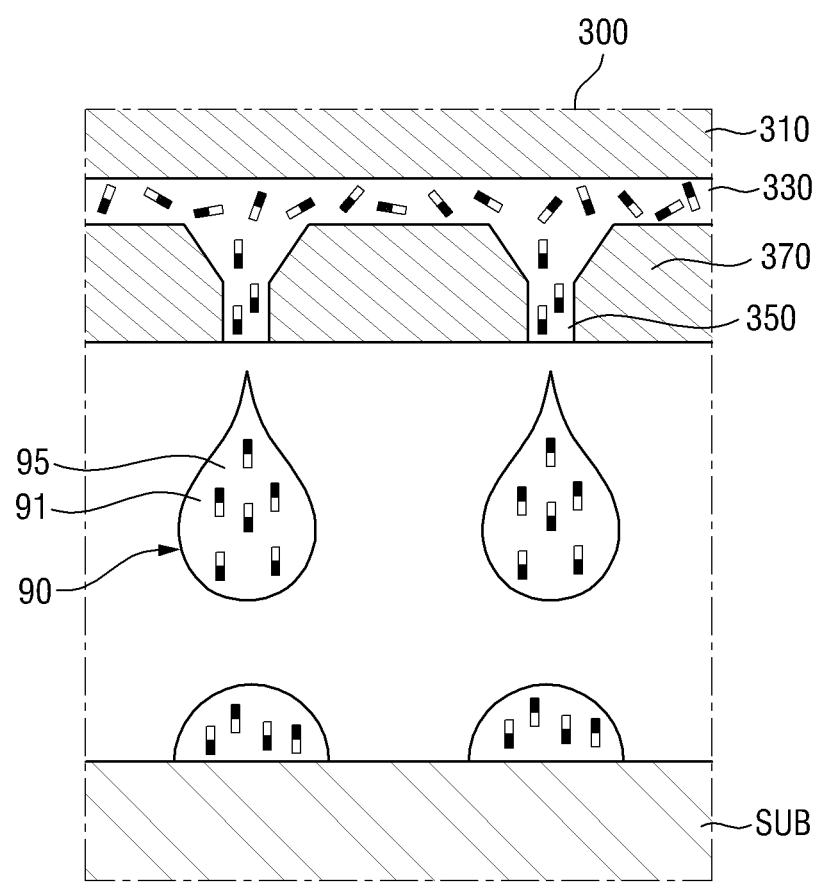
FIG. 6 is a schematic view illustrating ink ejected from an inkjet head according to an embodiment.

FIG. 6 is a schematic view illustrating ink ejected from an inkjet head according to an embodiment.

Referring to FIG. 6, the ink 90 ejected from the inkjet head 300 is sprayed onto the target substrate SUB. The bipolar elements 95 having a random orientation in the inner tube 330 may be ejected with an arbitrary orientation direction through the nozzle 350. In an embodiment, the ink 90 may be ejected from the inkjet head 300 in a state in which the orientation direction of the long axis of the bipolar element 95 is perpendicular to the top surface of the target substrate SUB. In the ink 90 ejected from the inkjet head 300 and sprayed onto the target substrate SUB, the direction of the long axes of the bipolar elements 95 may face the top surface of the target substrate SUB. As will be described below, the bipolar elements 95 may be sprayed onto the target substrate SUB with an arbitrary orientation direction, and may be placed on the target substrate SUB with a specific orientation direction by the electric field generated by the electric field generation part 700.

The bipolar element 95 may include a first end having a first polarity and a second end having a second polarity. In the bipolar element 95 extending in a direction, a specific orientation direction may be defined based on a direction that the first end faces. FIGS. 5 and 6 illustrate that the bipolar elements 95 dispersed in the ink 90 faces an upward direction and a downward direction without the first end facing a uniform direction. However, the disclosure is not limited thereto. In some embodiments, the inkjet head 300 may further include a member for generating an electric field in the nozzle 350 such that the first ends of the bipolar elements 95 dispersed in the ink 90 face a same direction. A description thereof may refer to other embodiments.

In case that the ink 90 including the bipolar elements 95 is sprayed onto the target substrate SUB, the electric field generation part 700 may generate an electric field above the target substrate SUB. By the electric field, the bipolar elements 95 included in the ink 90 may be aligned to have a specific orientation direction. Hereinafter, the electric field generation part 700 will be described with reference to other drawings.

FIG. 7 is a schematic plan view of an electric field generation part according to an embodiment.

Referring to FIGS. 1 and 7, the electric field generation part 700 may include a sub-stage 710, a probe support 730, a probe part 750, and an aligner 780.

The electric field generation part 700 may be disposed on the stage STA and may move in the second direction DR2 together with the stage STA. The electric field generation part 700 on which the target substrate SUB is disposed may move along the stage STA, and the ink 90 may be sprayed above the electric field generation part 700. The electric field generation part 700 may generate an electric field above the target substrate SUB when the ink 90 is sprayed thereonto.

The sub-stage 710 may provide a space where the target substrate SUB is disposed. The probe support 730, the probe part 750, and the aligner 780 may be disposed on the sub-stage 710. The shape of the sub-stage 710 is not particularly limited, but for example, as illustrated in the drawing, the sub-stage 710 may have a quadrilateral shape with both sides extending in the first direction DR1 and the second direction DR2. The sub-stage 710 may include long sides extending in the first direction DR1 and short sides extending in the second direction DR2. However, the overall planar shape of the sub-stage 710 may vary depending on the shape of the target substrate SUB in a plan view. For example, in case that the target substrate SUB is rectangular in a plan view, the shape of the sub-stage 710 may be rectangular as illustrated in the drawing, and in case that the target substrate SUB has a circular planar shape, the sub-stage 710 may also have a circular shape in a plan view.

At least one aligner 780 may be disposed on the sub-stage 710. The aligner 780 may be disposed on each side of the sub-stage 710, and a region surrounded by the aligners 780 may be a region in which the target substrate SUB is disposed. In the drawing, it is illustrated that two aligners 780 are disposed on each side of the sub-stage 710 to be spaced apart from each other, and a total of eight aligners 780 are disposed on the sub-stage 710. However, the disclosure is not limited thereto, and the number, disposition, or the like of the aligners 780 may vary depending on the shape or type of the target substrate SUB.

The probe support 730 and the probe part 750 are disposed on the sub-stage 710. The probe support 730 may provide a space in which the probe part 750 is disposed on the sub-stage 710. The probe support 730 may be disposed on at least one side of the sub-stage 710 and extend in a direction in which a side portion extends. For example, as illustrated in the drawing, the probe support 730 may be disposed on the left and right sides of the sub-stage 710 to extend in the second direction DR2. However, the disclosure is not limited thereto, and a larger number of probe supports 730 may be included, and in some embodiments, may also be disposed on the upper and lower sides of the sub-stage 710. For example, the structure of the probe support 730 may vary according to the number, disposition, structure, or the like of the probe parts 750 included in the electric field generation part 700.

The probe part 750 may be disposed on the probe support 730 to form an electric field on the target substrate SUB prepared on the sub-stage 710. Similar to the probe support 730, the probe part 750 may extend in a direction, for example, the second direction DR2 to cover (or overlap) the entire target substrate SUB. For example, the size and shape of the probe support 730 and the probe part 750 may vary depending on the target substrate SUB.

In an embodiment, the probe part 750 may include a probe driver 753 disposed on the probe support 730, a probe jig 751 disposed on the probe driver 753 to receive an electrical signal, and a probe pad 758 electrically connected to the probe jig 751 to transmit the electrical signal to the target substrate SUB.

The probe driver 753 may be disposed on the probe support 730 to move the probe jig 751 and the probe pad 758. In an embodiment, the probe driver 753 may move the probe jig 751 in a horizontal direction and a vertical direction, for example, the first direction DR1, which is the horizontal direction, and the third direction DR3, which is the vertical direction. The probe pad 758 may be electrically connected to or separated from the target substrate SUB by the driving of the probe driver 753. During the process of the inkjet printing device 1000, in the step of forming an electric field above the target substrate SUB, the probe driver 753 may be driven to electrically connect the probe pad 758 to the target substrate SUB, and in other steps, the probe driver 753 may be driven again to separate the probe pad 758 from the target substrate SUB. A detailed description thereof will be given below with reference to other drawings.

The probe pad 758 may form an electric field on the target substrate SUB through an electrical signal transmitted from the probe jig 751. The probe pad 758 may be electrically connected to the target substrate SUB and transmit the electrical signal to form an electric field on the target substrate SUB. For example, the probe pad 758 may contact an electrode or a power pad of the target substrate SUB, and an electrical signal from the probe jig 751 may be transmitted to the electrode or the power pad. The electrical signal transmitted to the target substrate SUB may form an electric field on the target substrate SUB.

However, the disclosure is not limited thereto, and the probe pad 758 may be a member that forms an electric field through an electrical signal transmitted from the probe jig 751. For example, in case that the probe pad 758 receives the electrical signal to form an electric field, the probe pad 758 may not be electrically connected to the target substrate SUB.

The shape of the probe pad 758 is not particularly limited, but in an embodiment, the probe pad 758 may extend in a direction to cover (or overlap) the entire target substrate SUB.

The probe jig 751 may be electrically connected to the probe pad 758 and may be electrically connected to a separate voltage applying device. The probe jig 751 may transmit an electrical signal, transmitted from the voltage applying device, to the probe pad 758 to form an electric field on the target substrate SUB. The electrical signal transmitted to the probe jig 751 may be a voltage for forming an electric field, for example, an alternating current (AC) voltage.

The probe part 750 may include probe jigs 751, and the number thereof is not particularly limited. Although the drawing illustrates that three probe jigs 751 and three probe driver 753 are disposed, the probe part 750 may include a larger number of probe jigs 751 and probe drivers 753 to form an electric field having a higher density on the target substrate SUB.

The probe part 750 according to an embodiment is not limited thereto. Although the drawing illustrates that the probe part 750 is disposed on the probe support 730, for example, the electric field generation part 700, the probe part 750 may be disposed as a separate device in some embodiments. As long as the electric field generation part 700 includes a device capable of forming an electric field and may form an electric field on the target substrate SUB, the structure or disposition thereof is not limited.

Figure 8:
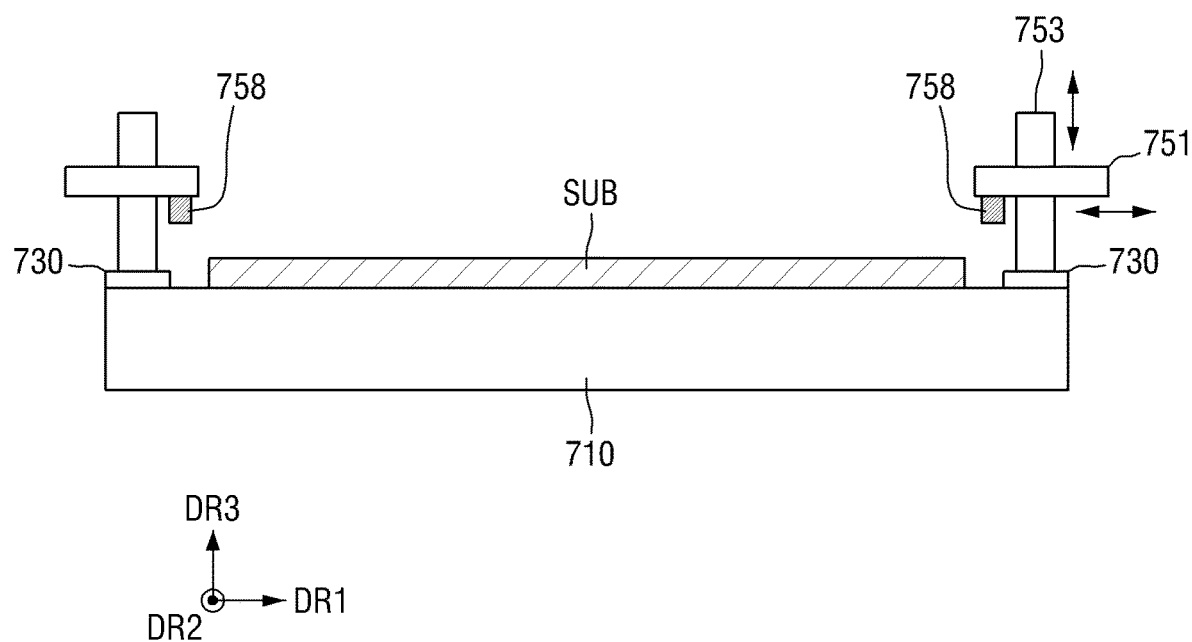
FIGS. 8 and 9 are schematic views illustrating an operation of a probe part according to an embodiment.
Figure 9:
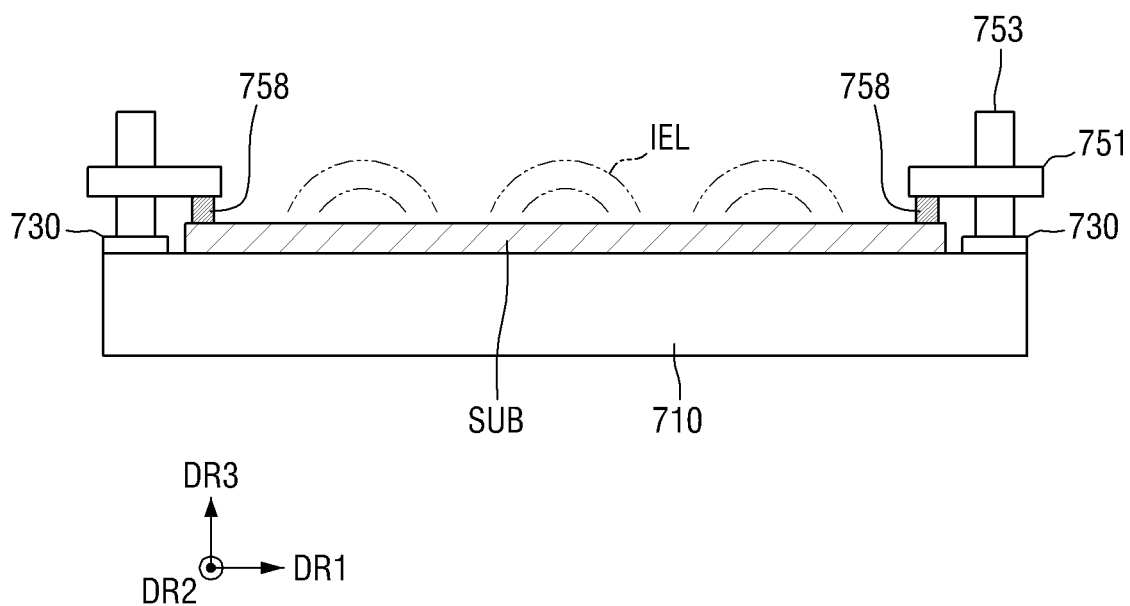

FIGS. 8 and 9 are schematic views illustrating an operation of a probe part according to an embodiment.

As described above, the probe driver 753 of the probe part 750 may be operated according to a process step of the inkjet printing device 1000. Referring to FIGS. 8 and 9, in a first state in which no electric field is formed by the electric field generation part 700, the probe part 750 may be disposed on the probe support 730 to be spaced apart from the target substrate SUB. The probe driver 753 of the probe part 750 may be driven in the second direction DR2, which is the horizontal direction, and in the third direction DR3, which is the vertical direction, to separate the probe pad 758 from the target substrate SUB.

In a second state in which an electric field is formed on the target substrate SUB, the probe driver 753 of the probe part 750 may be driven to electrically connect the probe pad 758 to the target substrate SUB. The probe driver 753 may be driven in the third direction DR3, which is the vertical direction, and in the first direction DR1, which is the horizontal direction, such that the probe pad 758 may contact the target substrate SUB. The probe jig 751 of the probe part 750 may transmit an electrical signal to the probe pad 758, and an electric field may be formed on the target substrate SUB.

It is illustrated in the drawing that a probe part 750 is disposed on each of both sides of the electric field generation part 700, and two probe parts 750 are simultaneously electrically connected to the target substrate SUB. However, the disclosure is not limited thereto, and each of the probe parts 750 may be driven separately. For example, in case that the target substrate SUB is prepared on the sub-stage 710 and the ink 90 is sprayed thereon, any first probe part 750 may first form an electric field on the target substrate SUB, and a second probe part 750 may not be electrically connected to the target substrate SUB. The first probe part 750 may be separated from the target substrate SUB and the second probe part 750 may be electrically connected to the target substrate SUB to form an electric field. For example, the probe parts 750 may be simultaneously driven to form an electric field, or each may be sequentially driven to sequentially form an electric field.

Figure 10:
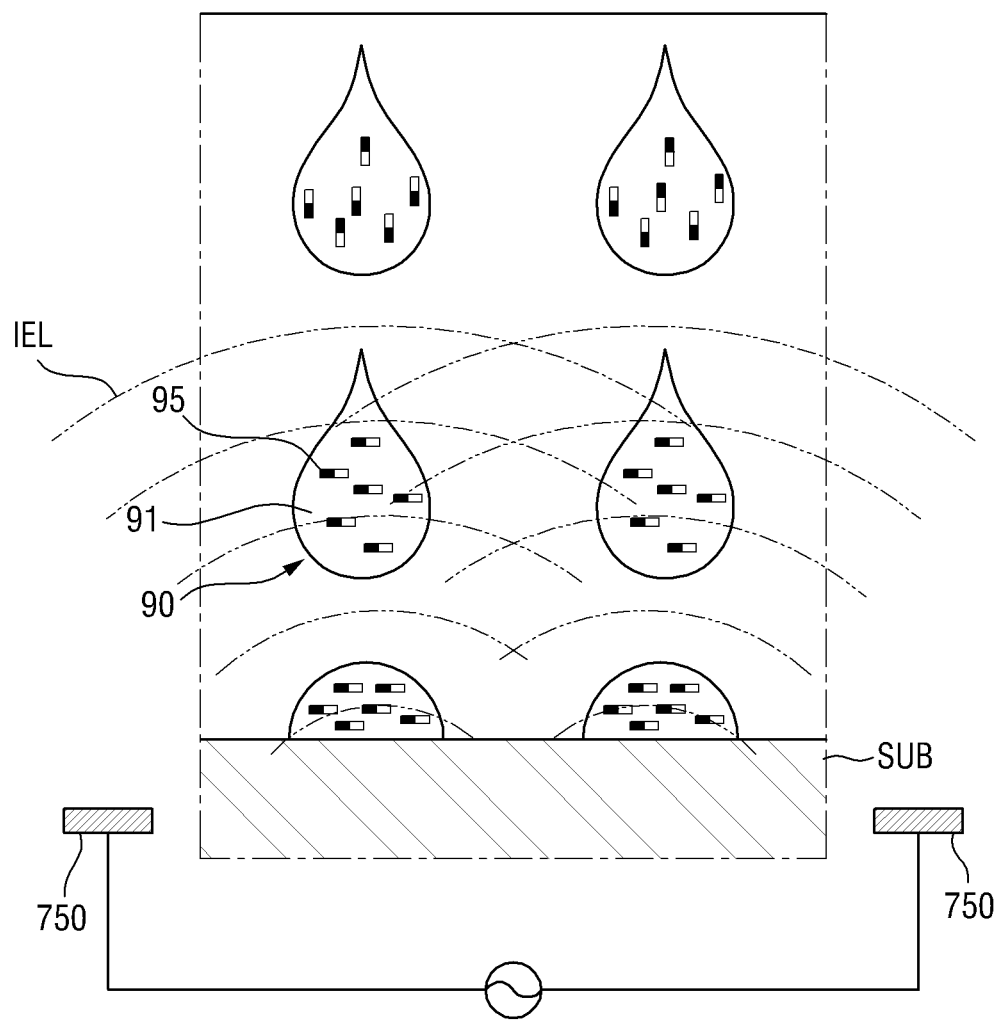
FIG. 10 is a schematic view illustrating that an electric field is generated on a target substrate by an electric field generation part according to an embodiment.

FIG. 10 is a schematic view illustrating that an electric field is generated on a target substrate by an electric field generation part according to an embodiment.

The bipolar element 95 may be an object having one end (or first end) having a first polarity and the other end (or second end) having a second polarity different from the first polarity. For example, one end of the bipolar element 95 may have a positive polarity, and the other end of the bipolar element 95 may have a negative polarity. The bipolar element 95 having different polarities at both ends thereof may receive electric forces (attractive and repulsive forces) when placed in an electric field, and the orientation direction thereof may be controlled.

Referring to FIG. 10, the ink 90 including the bipolar elements 95 is ejected from the nozzle 350 of the inkjet head 300. The ink 90 ejected from the nozzle 350 may be sprayed onto the target substrate SUB, including the bipolar elements 95 having an arbitrary orientation direction. In case that an electric field IEL is generated on the target substrate SUB, the bipolar element 95 having the first polarity and the second polarity may receive an electric force until or even after the ink 90 is placed on the target substrate SUB. By the electric force, the bipolar element 95 may be oriented according to the polarities of the first end and the second end. For example, the orientation direction of the bipolar element 95 may be a direction that the electric field IEL faces.

As described above, the bipolar element 95 ejected from the inkjet head 300 may be oriented such that the direction of the long axis thereof is perpendicular to the top surface of the target substrate SUB. The electric field IEL generated on the target substrate SUB may be formed in a direction horizontal to the top surface of the target substrate SUB, and the orientation direction and position of the first end and the second end of the bipolar element 95 may be changed in the direction of the electric field IEL. In an embodiment, the bipolar element 95 sprayed onto the target substrate SUB may be oriented such that by the electric field IEL, the extension direction faces a direction different from a direction perpendicular to the top surface of the target substrate SUB.

In case that the electric field IEL in the horizontal direction is generated on the target substrate SUB, the bipolar element 95 extending in a direction may be oriented such that the first end and the second end face a direction horizontal to the target substrate SUB. The bipolar element 95 may be oriented such that the first end having the first polarity faces a direction, and the second end having the second polarity faces the other direction. The bipolar element 95 ejected from the inkjet head 300 may be oriented such that the direction of the long axis thereof is perpendicular to the top surface of the target substrate SUB, but the first end of each bipolar element 95 faces a random direction. In contrast, in case that the bipolar elements 95 are sprayed onto the target substrate SUB and the electric field IEL is generated, the respective bipolar elements 95 may be oriented such that the first ends thereof face a same direction, and may be aligned on the target substrate SUB. The inkjet printing device 1000 may align the bipolar elements 95 on the target substrate SUB such that the first end has a specific direction.

Since the bipolar elements 95 ejected from the inkjet head 300 have an arbitrary orientation direction, the bipolar elements 95 may be smoothly aligned according to the direction of the electric field IEL generated on the target substrate SUB. For the bipolar elements 95 oriented on the target substrate SUB, with respect to any bipolar element 95, the orientation error of the other bipolar elements 95 may be calculated, and the alignment degree of the oriented bipolar elements 95 may be measured based thereon. The "alignment degree" of the bipolar elements 95 may mean a degree of error between orientation directions of the bipolar elements 95 aligned on the target substrate SUB. For example, it may be understood that in case that the error between the orientation directions of the bipolar elements 95 is large, the alignment degree of the bipolar elements 95 is low, and in case that the error between the orientation directions of the bipolar elements 95 is small, the alignment degree of the bipolar elements 95 is high or improved.

In case that the bipolar elements 95 are sprayed onto the target substrate SUB while having a random orientation, although the bipolar elements 95 receive an electric force by the electric field IEL, the degree to which the bipolar elements 95 are aligned to have a specific orientation direction may not be sufficient. The inkjet printing device 1000 according to an embodiment may eject the bipolar element 95 having an arbitrary orientation direction, and the alignment degree of the bipolar element 95 aligned on the target substrate SUB may be improved.

A time point at which the electric field generation part 700 generates the electric field IEL above the target substrate SUB is not particularly limited. The drawing illustrates that the probe part 750 generates the electric field IEL while the ink 90 is ejected from the nozzle 350 and reaches the target substrate SUB. Accordingly, the bipolar element 95 may receive a force due to the electric field IEL until the bipolar element 95 is ejected from the nozzle 350 and reaches the target substrate SUB. However, the disclosure is not limited thereto, and in some embodiments, the probe part 750 may generate the electric field IEL after the ink 90 is sprayed onto the target substrate SUB. The electric field generation part 700 may generate the electric field IEL in case that the ink 90 is sprayed from the inkjet head 300 or thereafter.

Although not illustrated in the drawings, in some embodiments, an electric field generation member may be further disposed on the sub-stage 710. The electric field generation member may form an electric field in an upward direction (for example, the third direction DR3) or above the target substrate SUB, similar to the probe part 750 to be described below. In an embodiment, an antenna part or a device including electrodes may be applied as the electric field generation member.

Although not illustrated in the drawings, the inkjet printing device 1000 according to an embodiment may further include a heat treatment part in which a process of volatilizing the ink 90 sprayed onto the target substrate SUB is performed. The heat treatment part may irradiate or emit heat to the ink 90 sprayed onto the target substrate SUB such that the solvent 91 of the ink 90 is volatilized and removed, and the bipolar element 95 may be disposed on the target substrate SUB. The process of removing the solvent 91 by irradiating heat to the ink 90 may be performed by using a conventional heat treatment part. A detailed description thereof will be omitted.

The inkjet printing device 1000 may include the nozzle 350 in which the inkjet head 300 has the inclined second side surface S2 such that the bipolar elements 95 may be ejected in an arbitrary orientation direction. In the ink 90 sprayed onto the target substrate SUB, the bipolar elements 95 may be dispersed in an arbitrary orientation direction, and the bipolar elements 95 may be aligned in a specific orientation direction by the electric field IEL generated by the electric field generation part 700. The inkjet printing device 1000 according to an embodiment may improve the alignment degree of the bipolar element 95 aligned on the target substrate SUB.

Hereinafter, various embodiments of the inkjet printing device 1000 will be described.

As described above, the bipolar element 95 may include a first end having a first polarity and a second end having a second polarity, and may have a specific orientation direction that the first end faces. The inkjet head 300 according to an embodiment further includes a member generating the electric field IEL in the nozzle 350 such that the bipolar elements 95 to be ejected may be induced to have a specific orientation direction with the first ends thereof facing a same direction.

Figure 11:
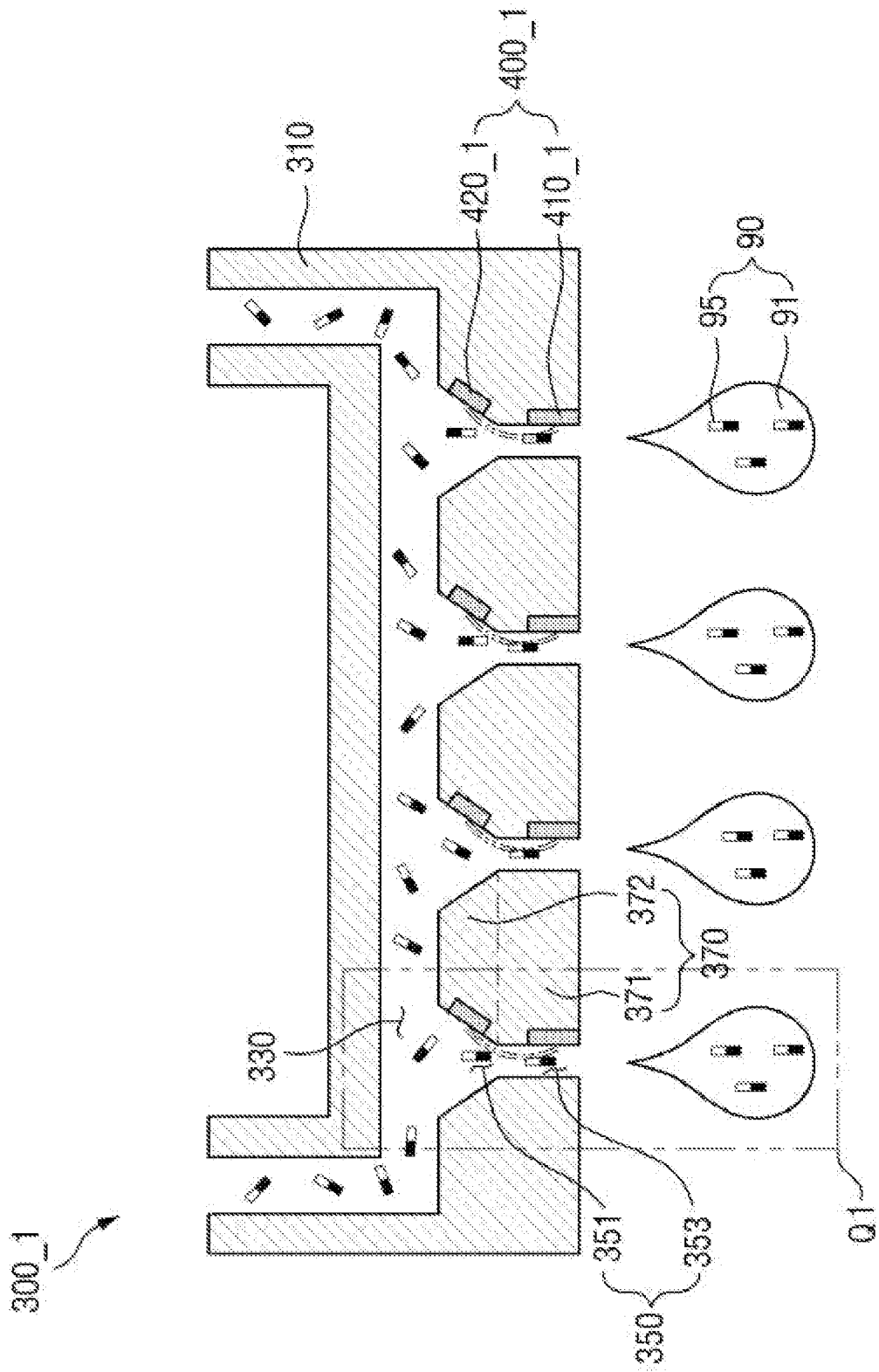
FIG. 11 is a schematic cross-sectional view of an inkjet head according to another embodiment.
Figure 12:
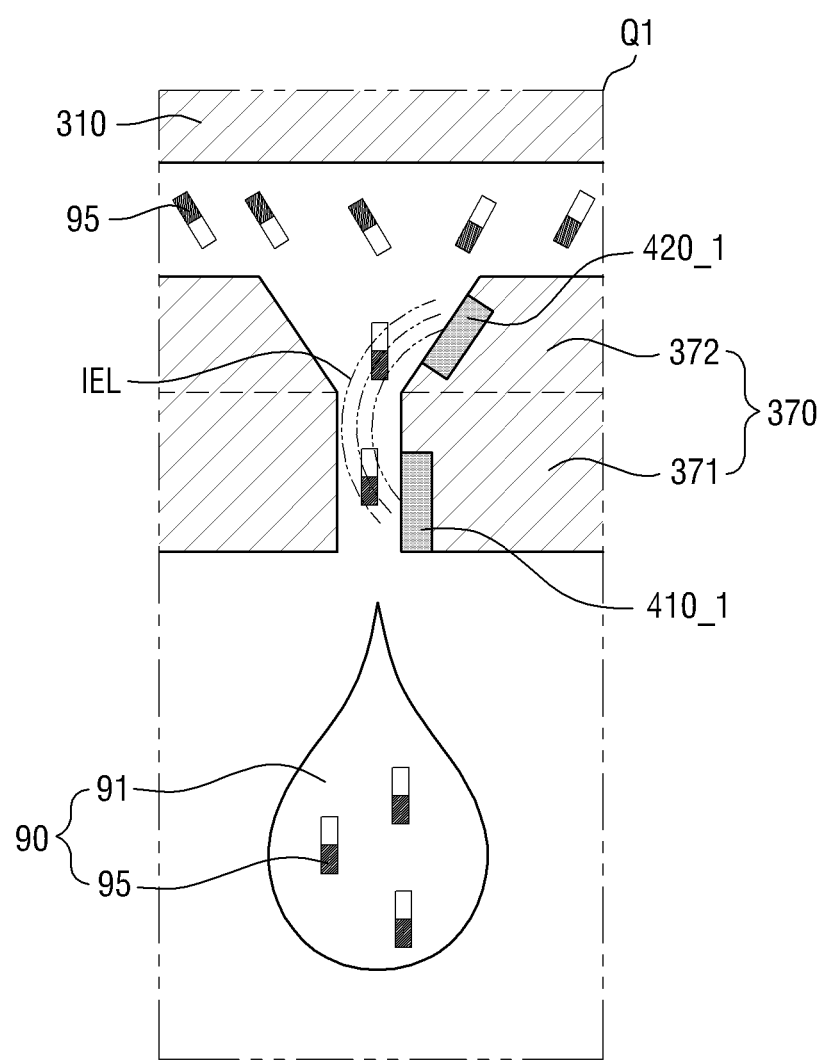
FIG. 12 is a schematic enlarged view of part Q1 of FIG. 11.

FIG. 11 is a schematic cross-sectional view of an inkjet head according to another embodiment. FIG. 12 is a schematic enlarged view of part Q1 of FIG. 11.

Referring to FIGS. 11 and 12, an inkjet head 300_1 according to an embodiment may further include an electric field generation electrode 400_1 disposed on the guide part 370. The electric field generation electrode 400_1 may generate the electric field IEL in the nozzle 350 by an applied electrical signal. The bipolar element 95 ejected through the nozzle 350 may be aligned such that the first end and the second end having polarities face a specific direction by the electric field IEL generated by the electric field generation electrode 400_1. In the embodiment, the electric field generation electrode 400_1 disposed on the guide part 370 may be further included such that the bipolar elements 95 dispersed in the ink 90 may be ejected in an aligned state so that the first ends face a same direction. Descriptions of the other members are the same as those of the embodiment of FIG. 4, and thus hereinafter, repetitive descriptions thereof will be omitted while focusing on differences.

The electric field generation electrode 400_1 may be disposed on a side surface of the guide part 370. The electric field generation electrode 400_1 may include a first electric field generation electrode 410_1 and a second electric field generation electrode 420_1, the first electric field generation electrode 410_1 may be disposed on one side surface of the first guide part 371, and the second electric field generation electrode 420_1 may be disposed on one side surface of the second guide part 372. The first electric field generation electrode 410_1 may be disposed on one side surface of the first guide part 371 to be disposed on the first side surface S1 of the outlet 353, and the second electric field generation electrode 420_1 may be disposed on one side surface of the second guide part 372 to be disposed on the second side surface S2 of the inlet 351. As described above, the first side surface S1 of the outlet 353 may extend in a direction, and the second side surface S2 of the inlet 351 may be formed to be inclined. Accordingly, the first electric field generation electrode 410_1 may be disposed on a side surface extending in a direction, and the second electric field generation electrode 420_1 may be disposed on a side surface formed to be inclined.

According to an embodiment, the first electric field generation electrode 410_1 and the second electric field generation electrode 420_1 may be spaced apart from each other in a direction. The first electric field generation electrode 410_1 and the second electric field generation electrode 420_1 may be disposed to be spaced apart from each other along side surfaces of the nozzle 350. The first electric field generation electrode 410_1 may be disposed below the second electric field generation electrode 420_1.

The first electric field generation electrode 410_1 and the second electric field generation electrode 420_1 and the probe part 750 of the electric field generation part 700 may perform substantially a same function. However, the electric field generation electrode 400_1 is different from the electric field generation part 700 in that the electric field generation electrode 400_1 is directly disposed in the inkjet head 300.

A predetermined electrical signal may be applied to the first electric field generation electrode 410_1 and the second electric field generation electrode 420_1, and an electric field IEL may be generated therebetween. In an embodiment, the first electric field generation electrode 410_1 and the second electric field generation electrode 420_1 may generate the electric field IEL that faces a direction in which the first side surface S1 extends, in the inlet 351 and the outlet 353. The electric field IEL may align the bipolar elements 95 dispersed in the ink 90 such that the first ends having the first polarities face a same direction. Unlike the embodiment of FIG. 5, the inkjet head 300_1 of FIGS. 11 and 12 may further include the electric field generation electrode 400_1 such that the bipolar elements 95 to be ejected may be aligned in a specific orientation direction so that the first ends have the same direction. Accordingly, the bipolar elements 95, which are aligned such that the first ends thereof face the same direction, may be dispersed in the ink 90 that is sprayed onto the target substrate SUB, and the bipolar element 95 may be smoothly aligned by the electric field IEL generated by the electric field generation part 700. For example, the inkjet printing device 1000 further including the electric field generation electrode 400_1 may further improve the alignment degree of the bipolar element 95.

Figure 13:
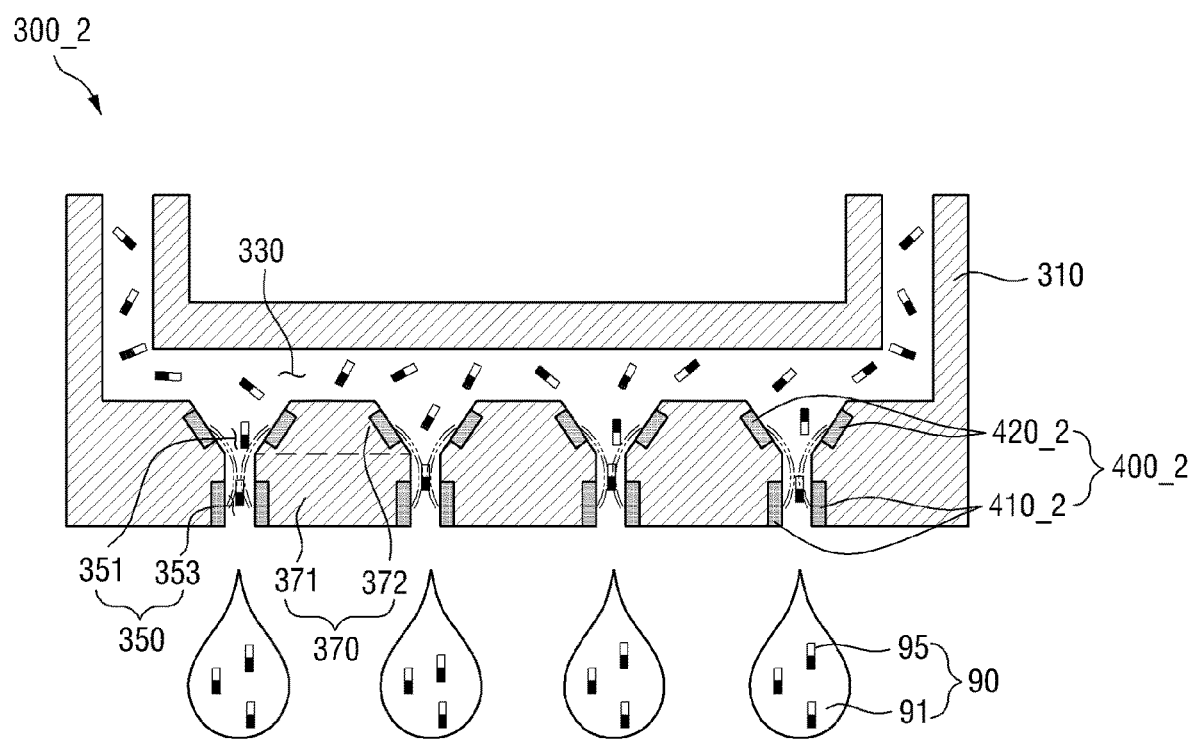
FIG. 13 is a schematic cross-sectional view illustrating another example of the inkjet head of FIG. 11.
Figure 14:
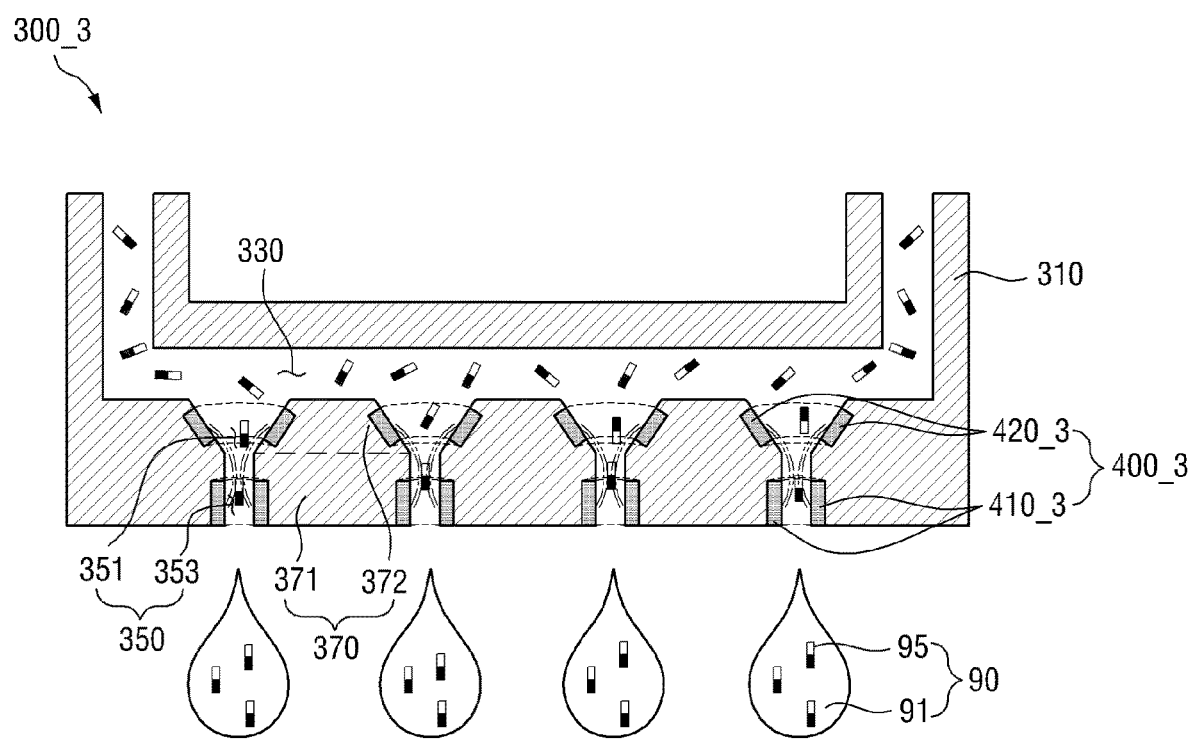
FIG. 14 is a schematic cross-sectional view illustrating still another example of the inkjet head of FIG. 11.

FIG. 13 is a schematic cross-sectional view illustrating another example of the inkjet head of FIG. 11. FIG. 14 is a schematic cross-sectional view illustrating still another example of the inkjet head of FIG. 11.

Referring to FIG. 13, an inkjet head 300_2 may include a larger number of electric field generation electrodes 400_2. A first electric field generation electrode 410_2 may be disposed on both side surfaces of the first guide part 371, and a second electric field generation electrode 420_2 may be disposed on both side surfaces of the second guide part 372. Accordingly, a stronger electric field IEL may be generated in the nozzle 350 of the inkjet head 300_2, and the bipolar elements 95 may be ejected from the inkjet head 300_2 in an aligned state in a specific orientation direction. The embodiment is different from the embodiment of FIG. 11 in that a larger number of electric field generation electrodes 400_2 are disposed.

Referring to FIG. 14, in the inkjet head 300_3, electric field generation electrodes 400_3 may be disposed to surround the nozzle 350. Accordingly, the uniform electric field IEL may be generated in the nozzle 350 of the inkjet head 300_3 according to the position, and the bipolar elements 95 may receive a force due to the uniform electric field IEL until the bipolar elements 95 are ejected through the nozzle 350. The embodiment is different from the embodiment of FIG. 13 in that the disposition of the electric field generation electrode 400_3 is different. Hereinafter, repetitive descriptions thereof will be omitted. The first electric field generation electrode 410_3 and second electric field generation electrode 420_3 may be substantially identical or similar to the first electric field generation electrode 410_2 and second electric field generation electrode 420_2 shown in FIG. 13.

Figure 15:
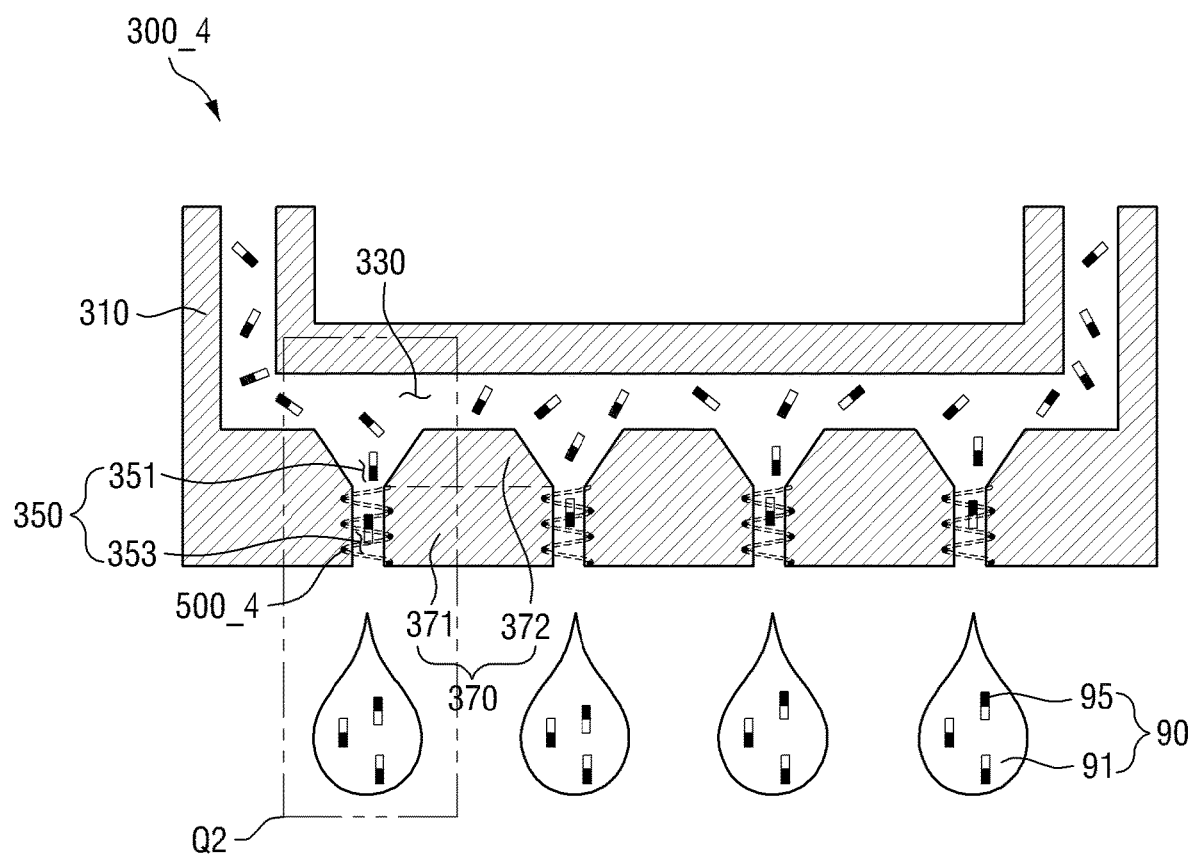
FIG. 15 is a schematic cross-sectional view of an inkjet head according to still another embodiment.
Figure 16:
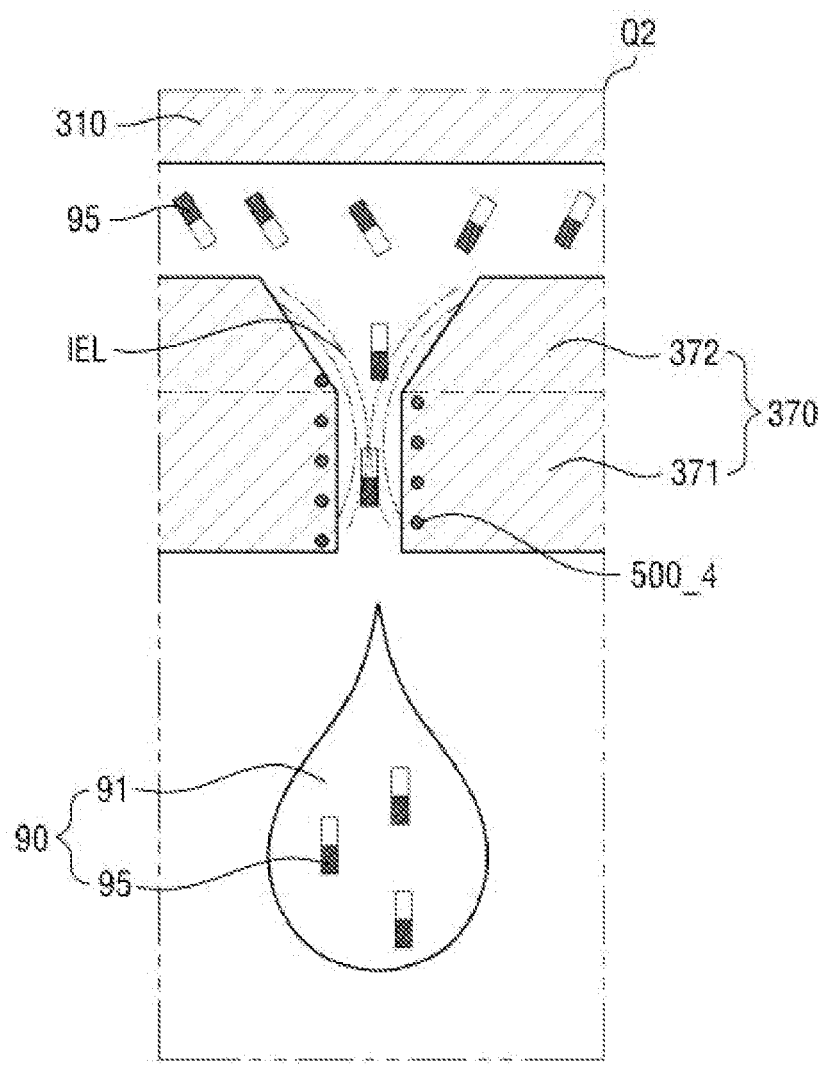
FIG. 16 is a schematic enlarged view of part Q2 of FIG. 15.

FIG. 15 is a schematic cross-sectional view of an inkjet head according to still another embodiment. FIG. 16 is a schematic enlarged view of part Q2 of FIG. 15.

Referring to FIGS. 15 and 16, an inkjet head 300_4 according to an embodiment may include an electric field generation coil 500_4 disposed to surround the nozzle 350. The electric field generation coil 500_4 may generate an electric field IEL in a direction in which the coil extends, by the flowing current. The electric field generation coil 500_4 disposed to surround at least the outlet 353 in the nozzles 350 may generate the electric field IEL in a direction in which the first side surface S1 of the outlet 353 extends. The bipolar elements 95 introduced into the nozzle 350 may have a first end and a second end that are oriented according to the direction of the electric field IEL, and may be ejected from the inkjet head 300_4 in an aligned state having a specific orientation direction. The embodiment is different from the embodiment of FIG. 11 in that a member generating the electric field IEL in the nozzle 350 of the inkjet head 300_4 is the electric field generation coil 500_4. Hereinafter, repetitive descriptions thereof will be omitted.

Figure 17:
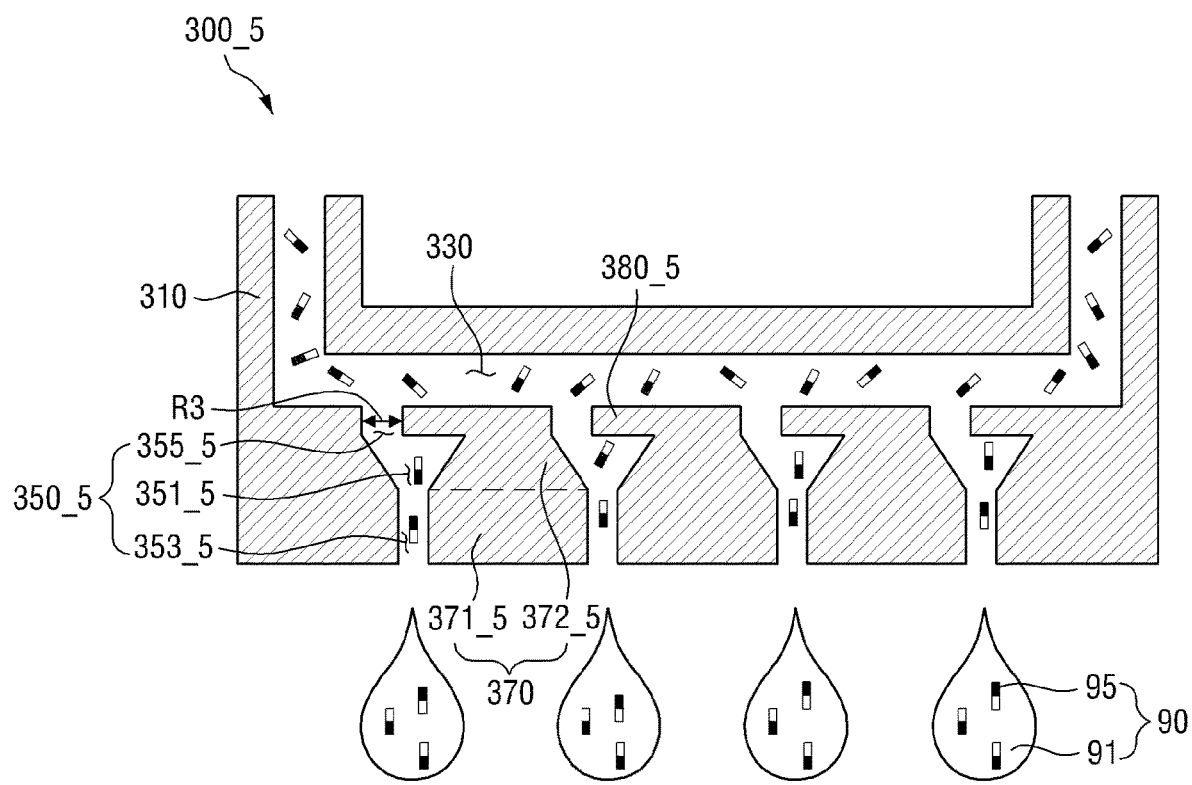
FIG. 17 is a schematic cross-sectional view of an inkjet head according to still another embodiment.
Figure 18:
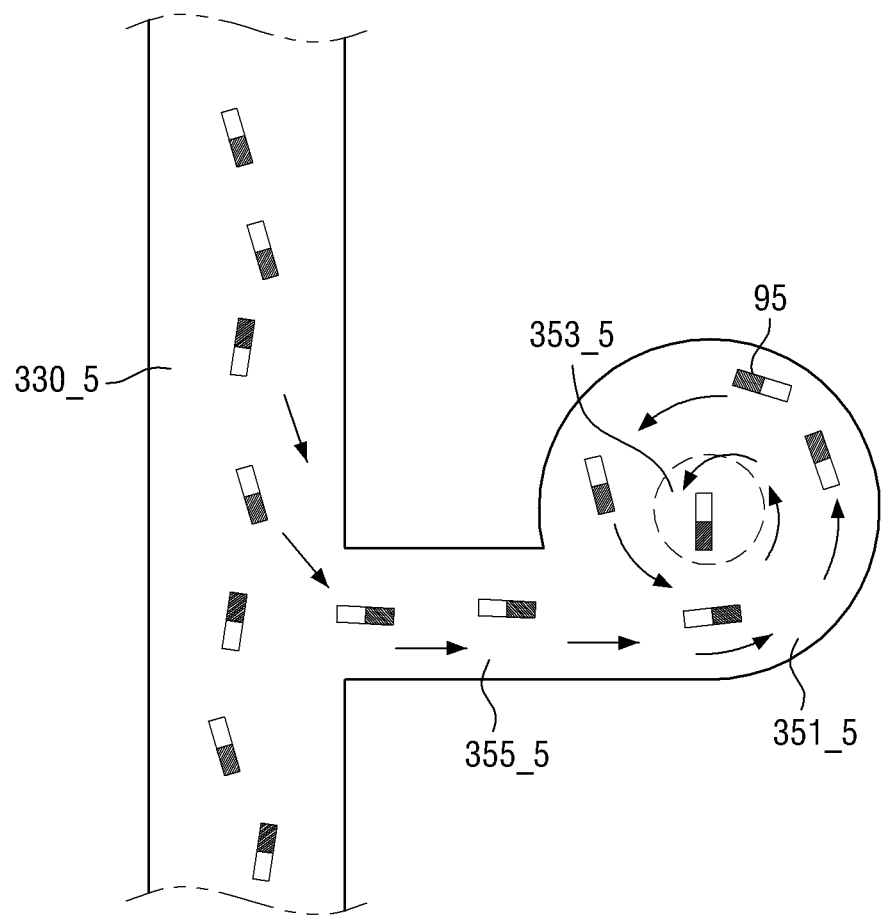
FIG. 18 is a schematic view illustrating ink flowing in the inkjet head of FIG. 17.

FIG. 17 is a schematic cross-sectional view of an inkjet head according to still another embodiment. FIG. 18 is a schematic view illustrating ink flowing in the inkjet head of FIG. 17.

Referring to FIGS. 17 and 18, an inkjet head 300_5 according to an embodiment may further include third guide parts 380_5 disposed between an inlet 351_5 and an inner tube 330_5, and a nozzle 350_5 may further include an inlet tube 355_5 formed by a space between the third guide parts 380_5 between the inner tube 330 and the inlet 351_5. The embodiment is different from the embodiment of FIG. 5 in that the inkjet head 300_5 further includes the third guide part 380_5 such that the ink 90 flowing along the inner tube 330_5 is supplied to the inlet 351_5 through the inlet tube 355_5. In the following description, repetitive descriptions thereof will be omitted while focusing on differences.

The third guide part 380_5 may be disposed on a second guide part 372_5. The third guide part 380_5 may extend in a direction and may protrude from a side surface of the inlet 351_5 toward the other side surface. A first guide part 371_5 and a second guide part 372_5 may be positioned between the nozzles 350_5, and the third guide part 380_5 may also be disposed between the nozzles 350_5. The inkjet head 300_5 may include the third guide parts 380_5, which may be spaced apart from each other. The third guide part 380_5 may be disposed between the inner tube 330 and the inlet 351_5 of the nozzle 350_5, and the inlet tube 355_5 may be formed in a space where the third guide parts 380_5 are spaced apart.

As the third guide part 380_5 is disposed between the inner tube 330_5 and the inlet 351_5, the entrance of the inlet 351_5 through which the ink 90 is supplied from the inner tube 330_5 may be narrowed. For example, a third diameter R3 that is the diameter of the inlet tube 355_5 may be smaller than a first diameter R1 that is the diameter of the inlet 351_5. The ink 90 flowing along the inner tube 330_5 may be supplied to the inlet 351_5 through the inlet tube 355_5 having a narrow diameter. The flow rate of the ink 90 increases while the ink 90 flows through the inlet tube 355_5, and the ink 90 may be introduced into an outlet 353_5 with an increased flow rate along the inclined side surface of the inlet 351_5.

FIG. 18 schematically illustrates that the ink 90 is supplied to the inlet 351_5 through the inlet tube 355_5 formed by the third guide part 380_5. Although not illustrated in FIG. 18, it may be understood that the third guide part 380_5 is positioned above and below the inlet tube 355_5. As illustrated in the drawing, the ink 90 flowing along the inner tube 330_5 may be supplied to the inlet 351_5 through the inlet tube 355_5. The ink 90 supplied from the inner tube 330_5 having a relatively wide diameter to the inlet tube 355_5 having a narrow diameter flows along the side surface of the inlet 351_5 with a high flow rate. In an embodiment, in case that the inlet 351_5 has a circular shape in a plan view, the ink 90 may flow while rotating along the side surface of the inlet 351_5, and may be introduced into the outlet 353_5 while having a rotational force.

As described above, the inlet 351_5 may be formed such that the second side surface S2, which is a side surface, is inclined, and the bipolar elements 95 dispersed in the ink 90 having a high flow rate may have an arbitrary orientation direction. The inkjet head 300_5 according to an embodiment may further include the third guide part 380_5 to induce the bipolar element 95 to be ejected from the nozzle 350_5 in an arbitrary orientation direction. In case that the bipolar element 95 is sprayed onto the target substrate SUB, the bipolar element 95 may be aligned to have a specific orientation direction by the electric field IEL generated by the electric field generation part 700. Hereinafter, repetitive descriptions thereof will be omitted.

The inkjet printing device 1000 described above may eject the ink 90 in which the bipolar elements 95 are arranged in an arbitrary direction. The ink 90 having the bipolar elements 95 arranged therein is sprayed onto the target substrate SUB, and the electric field generation part 700 generates the electric field IEL above the target substrate SUB onto which the ink 90 is sprayed. The orientation direction and position of the bipolar element 95 may be changed by the electric field IEL, and the bipolar element 95 may be aligned in a specific direction on the target substrate SUB. Hereinafter, a method for aligning the bipolar element 95 by using the inkjet printing device 1000 according to an embodiment will be described in detail.

Figure 19:
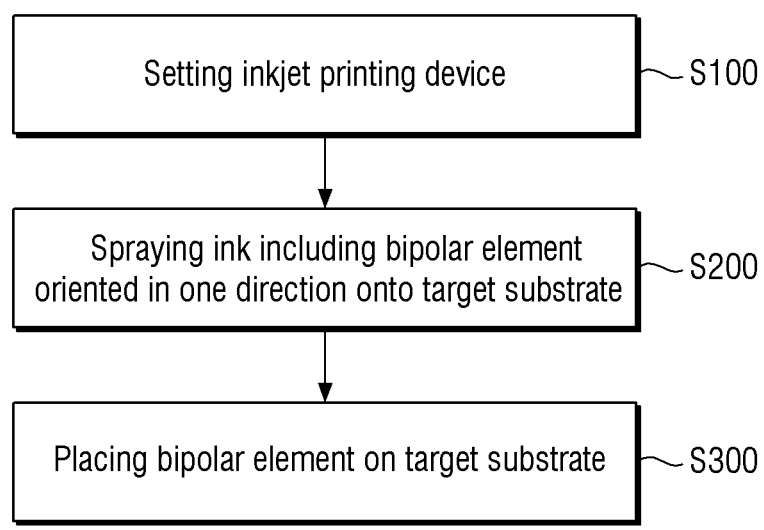
FIG. 19 is a schematic flowchart illustrating a method for aligning a bipolar element according to an embodiment.

FIG. 19 is a flowchart illustrating a method for aligning a bipolar element according to an embodiment. FIGS. 20 to 23 are schematic cross-sectional views illustrating a method for aligning a bipolar element by using an inkjet printing device according to an embodiment.

Referring to FIGS. 1 and 19 to 23, the method for aligning the bipolar element 95 according to an embodiment may include setting the inkjet printing device 1000 (step S100), spraying the ink 90, including the bipolar element 95 oriented in a direction, onto the target substrate SUB (step S200), and placing the bipolar element 95 on the target substrate SUB (step S300).

The method for aligning the bipolar element 95 according to an embodiment may be performed using the inkjet printing device 1000 described above with reference to FIG. 1, and in case that the ink 90 is sprayed on the target substrate SUB, the bipolar elements 95 may be ejected in a state of being oriented in an arbitrary direction. Thereafter, the bipolar elements 95 may be aligned in a direction by the electric field IEL generated above the target substrate SUB.

First, the inkjet printing device 1000 is set (step S100). The step S100 of setting the inkjet printing device 1000 is a step of tuning the inkjet printing device 1000 according to a target process. For precise tuning, an inkjet print test process is performed on an inspection substrate, and a setting value of the inkjet printing device 1000 may be adjusted according to the result.

Specifically, an inspection substrate is prepared first. The inspection substrate and the target substrate SUB may have a same structure, but a bare substrate such as a glass substrate may be used.

Then, the top surface of the inspection substrate is treated with a water repellent treatment. The water repellent treatment may be performed by fluorine coating or plasma surface treatment.

Next, the ink 90 including the bipolar element 95 is sprayed onto the top surface of the inspection substrate using the inkjet printing device 1000, and a droplet amount for each inkjet head 300 is measured. The measurement of the droplet amount for each inkjet head 300 may be performed by using a camera to check the size of the droplet at the moment the droplet is sprayed and the size of the droplet applied to the substrate. In case that the measured droplet amount is different from a reference droplet amount, a voltage for each corresponding inkjet head 300 is adjusted such that the reference droplet amount may be ejected. Such an inspection method may be repeated several times until each inkjet head 300 ejects an accurate droplet amount.

However, the disclosure is not limited thereto, and the above-described step S100 of setting the inkjet printing device may be omitted.

Next, when the setting of the inkjet printing device 1000 is completed, as illustrated in FIG. 20, the target substrate SUB is prepared. In an embodiment, a first electrode 21 and a second electrode 22 may be disposed on the target substrate SUB. Although the drawing illustrates that a pair of electrodes are disposed, a larger number of electrode pairs may be formed on the target substrate SUB, and the inkjet heads 300 may spray the ink 90 onto each electrode pair in a same manner.

Subsequently, as illustrated in FIG. 21, the ink 90 including the solvent 91 in which the bipolar elements 95 are dispersed is sprayed on the target substrate SUB (step S200). The ink 90 may be ejected from the inkjet head 300 of the print head part 100, and may be sprayed onto the first electrode 21 and the second electrode 22 disposed on the target substrate SUB. In particular, the inkjet head 300 according to an embodiment may include the nozzle 350 including the inlet 351 and the outlet 353 that have different widths, and the bipolar elements 95 dispersed in the ink 90 may be ejected in a state of being oriented in a direction. The ink 90 may be sprayed onto the first electrode 21 and the second electrode 22 disposed on the target substrate SUB, and a direction in which the bipolar elements 95 dispersed in the ink 90 extend may be oriented in a direction perpendicular to the top surface of the target substrate SUB. Although not illustrated in the drawings, in case that the inkjet head 300 is the inkjet head 300 of FIGS. 11 to 16, each of the bipolar elements 95 dispersed in the ink 90 may be sprayed in an aligned state in which the first end having the first polarity or the second end having the second polarity have a same direction. A description thereof is the same as that described above, and thus a detailed description thereof will be omitted.

Figure 22:
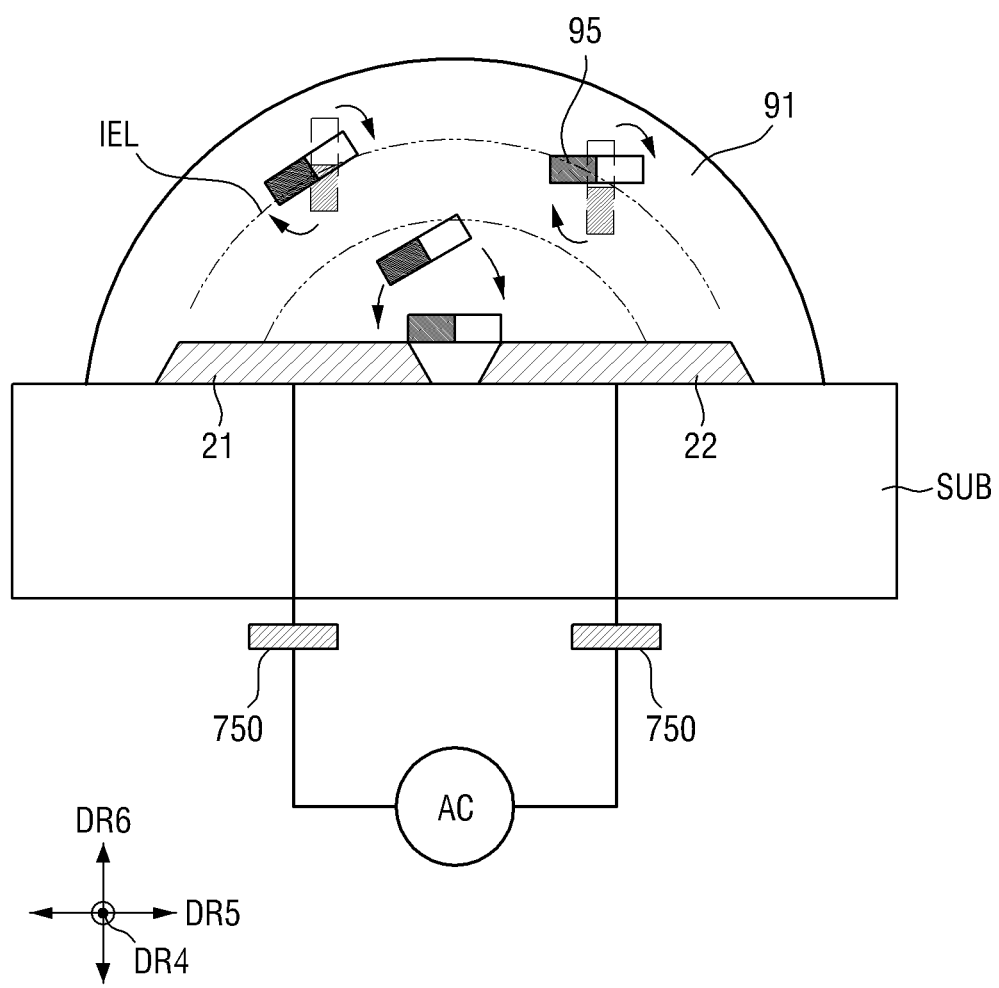

Next, referring to FIG. 22, the electric field IEL is generated on the target substrate SUB, and the bipolar element 95 is placed on the target substrate SUB by the electric field IEL (step S300). In some embodiments, the bipolar element 95 may be disposed between the first electrode 21 and the second electrode 22 by receiving a dielectrophoretic force by the electric field IEL generated above the target substrate SUB.

Specifically, an electrical signal is applied to the first electrode 21 and the second electrode 22 using the probe part 750. The probe part 750 may be electrically connected to a pad (not shown) provided on the target substrate SUB, and may apply an electrical signal to the first electrode 21 and the second electrode 22 electrically connected to the pad. In an embodiment, the electrical signal may be an AC voltage, and the AC voltage may have a voltage of ±(about 10 to about 50) V and a frequency of about 10 kHz to about 1 MHz. In case that the AC voltage is applied to the first electrode 21 and the second electrode 22, the electric field IEL is formed therebetween, and the bipolar element 95 receives the dielectrophoretic force caused by the electric field IEL. The bipolar element 95 receiving the dielectrophoretic force may be disposed on the first electrode 21 and the second electrode 22 while the orientation direction and position thereof are changed.

As illustrated in the drawing, the orientation direction of the bipolar elements 95 dispersed in the ink 90 such that a direction of extension thereof is perpendicular to the target substrate SUB may be changed according to the direction of the electric field IEL. According to an embodiment, the bipolar element 95 may be aligned by the electric field IEL such that a direction of extension thereof faces the direction that the electric field IEL faces. In case that the electric field IEL generated on the target substrate SUB is generated parallel to the top surface of the target substrate SUB, the bipolar element 95 may be aligned such that the extension direction is parallel to the target substrate SUB, and may be disposed between the first electrode 21 and the second electrode 22. In some embodiments, the step of placing the bipolar element 95 is a step of placing the bipolar element 95 between the first electrode 21 and the second electrode 22, and at least one end of the bipolar element 95 may be disposed on at least one of the first electrode 21 or the second electrode 22. However, the disclosure is not limited thereto, and the bipolar element 95 may be directly disposed on the target substrate SUB between the first electrode 21 and the second electrode 22.

Next, as illustrated in FIG. 23, the solvent 91 of the ink 90 sprayed onto the target substrate SUB is removed. The step of removing the solvent 91 is performed by a heat treatment device, and the heat treatment device may irradiate the target substrate SUB with heat or infrared rays. Since the solvent 91 is removed from the ink 90 sprayed onto the target substrate SUB, the flow of the bipolar element 95 may be prevented, and the bipolar element 95 may be placed on the electrodes 21 and 22.

By the above method, the inkjet printing device 1000 according to an embodiment may align the bipolar element 95 on the target substrate SUB.

The above-described bipolar element 95 may be a light emitting element including semiconductor layers, and according to an embodiment, a display device including the light emitting element may be manufactured using the inkjet printing device 1000.

Figure 24:
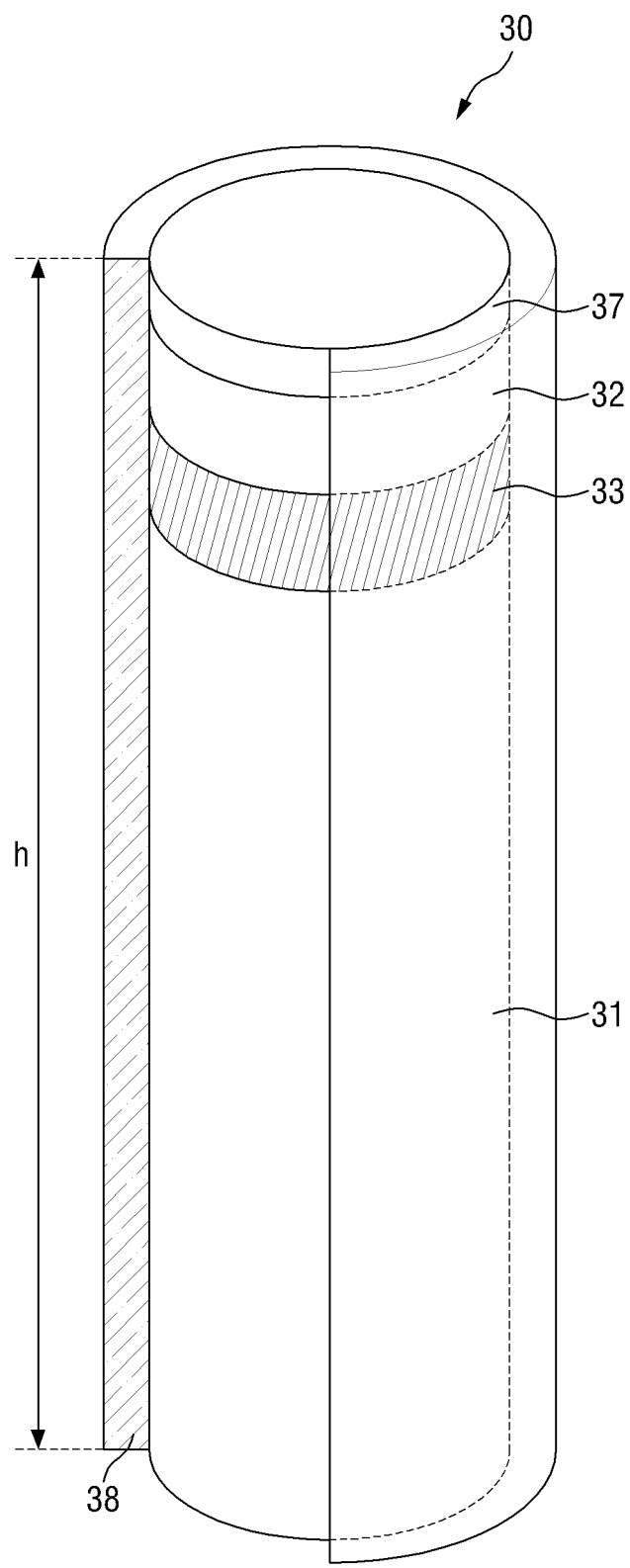
FIG. 24 is a schematic view of a light emitting element according to an embodiment.

FIG. 24 is a schematic view of a light emitting element according to an embodiment.

A light emitting element 30 may be a light emitting diode. Specifically, the light emitting element 30 may be an inorganic light emitting diode that has a micrometer or nanometer size, and is made of an inorganic material. The inorganic light emitting diode may be aligned between two electrodes having polarity in case that an electric field is formed in a specific direction between two electrodes opposing each other. The light emitting element 30 may be aligned between two electrodes by the electric field generated between the electrodes.

The light emitting element 30 according to an embodiment may extend in a direction. The light emitting element 30 may have a shape of a rod, wire, tube, or the like. In an embodiment, the light emitting element 30 may have a cylindrical or rod shape. However, the shape of the light emitting element 30 is not limited thereto, and the light emitting element 30 may have a polyprismatic shape such as a regular cube, a rectangular parallelepiped, and a hexagonal prism, or may have various shapes such as a shape in which the light emitting element 30 extends in a direction and has an outer surface partially inclined. Semiconductors included in the light emitting element 30 to be described below may have a structure in which they are sequentially arranged or stacked in the direction.

The light emitting element 30 may include a semiconductor layer doped with any conductivity type (e.g., p-type or n-type) impurities. The semiconductor layer may emit light of a specific wavelength band by receiving an electrical signal applied from an external power source.

Referring to FIG. 24, the light emitting element 30 may include a first semiconductor layer 31, a second semiconductor layer 32, an active layer 33, an electrode layer 37, and an insulating film 38.

The first semiconductor layer 31 may be an n-type semiconductor. For example, in case that the light emitting element 30 emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The first semiconductor layer 31 may be doped with an n-type dopant. For example, the n-type dopant may be Si, Ge, Sn, or the like. In an embodiment, the first semiconductor layer 31 may be n-GaN doped with n-type Si. The length of the first semiconductor layer 31 may have a range of about 1.5 μm to about 5 μm, but is not limited thereto.

The second semiconductor layer 32 is disposed on the active layer 33 to be described below. The second semiconductor layer 32 may be a p-type semiconductor. For example, in case that the light emitting element 30 emits light of a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN and InN. The second semiconductor layer 32 may be doped with a p-type dopant. For example, the p-type dopant may be Mg, Zn, Ca, Se, Ba, or the like. In an embodiment, the second semiconductor layer 32 may be p-GaN doped with p-type Mg. The length of the second semiconductor layer 32 may have a range of about 0.05 μm to about 0.10 μm, but is not limited thereto.

Although FIG. 24 illustrates that the first semiconductor layer 31 and the second semiconductor layer 32 are configured as a layer, the disclosure is not limited thereto. According to some embodiments, depending on the material of the active layer 33, the first semiconductor layer 31 and the second semiconductor layer 32 may further include a larger number of layers such as a cladding layer or a tensile strain barrier reducing (TSBR) layer. A description thereof will be given below with reference to other drawings.

The active layer 33 is disposed between the first semiconductor layer 31 and the second semiconductor layer 32. The active layer 33 may include a material having a single or multiple quantum well structure. In case that the active layer 33 includes a material having a multiple quantum well structure, the multiple quantum well structure may have quantum layers and well layers stacked alternately. The active layer 33 may emit light by coupling of electron-hole pairs according to an electrical signal applied thereto through the first semiconductor layer 31 and the second semiconductor layer 32. For example, in case that the active layer 33 emits light of a blue wavelength band, a material such as AlGaN or AlGaInN may be included. In case that the active layer 33 has a structure in which quantum layers and well layers are alternately stacked, the quantum layer may include a material such as AlGaN or AlGaInN, and the well layer may include a material such as GaN or AlInN. In an embodiment, as described above, the active layer 33 includes AlGaInN as a quantum layer and AlInN as a well layer, and the active layer 33 may emit blue light having a central wavelength band of about 450 nm to about 495 nm.

However, the disclosure is not limited thereto, and the active layer 33 may have a structure in which semiconductor materials having large band gap energy and semiconductor materials having small band gap energy are alternately stacked, and may include other group III to V semiconductor materials according to the wavelength band of emitted light. The light emitted from the active layer 33 is not limited to light of a blue wavelength band, but the active layer 36 may also emit light of a red or green wavelength band in some embodiments. The length of the active layer 33 may have a range of about 0.05 µm to about 0.10 µm, but is not limited thereto.

Light emitted from the active layer 33 may be emitted to both side surfaces as well as the outer surface of the light emitting element 30 in a longitudinal direction. The directionality of the light emitted from the active layer 33 is not limited to a direction.

The electrode layer 37 may be an ohmic contact electrode. However, the disclosure is not limited thereto, and it may be a Schottky contact electrode. The light emitting element 30 may include at least one electrode layer 37. Although FIG. 24 illustrates that the light emitting element 30 includes an electrode layer 37, the disclosure is not limited thereto. In some embodiments, the light emitting element 30 may include a larger number of electrode layers 37, or may be omitted. The following description of the light emitting element 30 may be equally applied even if the number of electrode layers 37 is different or further includes other structures.

In a display device 10 according to an embodiment, in case that the light emitting element 30 is electrically connected to an electrode or a contact electrode, the electrode layer 37 may reduce the resistance between the light emitting element 30 and the electrode or contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 37 may include an n-type or p-type doped semiconductor material. The electrode layer 37 may include a same material or different materials, but the disclosure is not limited thereto.

The insulating film 38 is arranged to surround the outer surfaces of the semiconductor layers and electrode layers described above. In an embodiment, the insulating film 38 may be arranged to surround at least the outer surface of the active layer 33 and extend in a direction in which the light emitting element 30 extends. The insulating film 38 may function to protect the members. For example, the insulating film 38 may be formed to surround side surfaces of the members to expose both ends of the light emitting element 30 in the longitudinal direction.

Although it is illustrated in the drawing that the insulating film 38 extends in the longitudinal direction of the light emitting element 30 to cover a region from the first semiconductor layer 31 to the side surface of the electrode layer 37, the disclosure is not limited thereto. The insulating film 38 may include the active layer 33 to cover only the outer surfaces of some semiconductor layers, or may cover only a portion of the outer surface of the electrode layer 37 to partially expose the outer surface of each electrode layer 37. Further, in a cross-sectional view, the insulating film 38 may have a top surface, which is rounded in a region adjacent to at least one end of the light emitting element 30.

The thickness of the insulating film 38 may have a range of about 10 nm to about 1.0 µm, but is not limited thereto. The thickness of the insulating film 38 may be about 40 nm.

The insulating film 38 may include materials having insulating properties, for example, silicon oxide ($SiO_x$), silicon nitride ($SiN_x$), silicon oxynitride ($SiO_xN_y$), aluminum nitride (AlN), aluminum oxide ($A_2O_3$), and the like. Accordingly, it is possible to prevent an electrical short circuit that may occur in case that the active layer 33 directly contacts the electrode through which the electrical signal is transmitted to the light emitting element 30. Since the insulating film 38 includes the active layer 33 to protect the outer surface of the light emitting element 30, it is possible to prevent degradation in luminous efficiency.

Further, in some embodiments, the insulating film 38 may have an outer surface which is surface-treated. In case that the display device 10 is manufactured, the light emitting elements 30 may be aligned by being sprayed on the electrodes in a state of being dispersed in ink. Here, the surface of the insulating film 38 may be treated in a hydrophobic or hydrophilic manner in order to keep the light emitting elements 30 in a dispersed state without aggregating with other light emitting elements 30 adjacent thereto in the ink.

The light emitting element 30 may have a length h of about 1 µm to about 10 µm or about 2 µm to about 6 µm, or about 3 µm to about 5 µm. Further, a diameter of the light emitting element 30 may have a range of about 30 nm to about 700 nm, and an aspect ratio of the light emitting element 30 may be about 1.2 to about 100. However, the disclosure is not limited thereto, and the light emitting elements 30 included in the display device 10 may have different diameters according to a difference in composition of the active layer 33. The diameter of the light emitting element 30 may have a range of about 500 nm.

The light emitting element 30 may extend in a direction. The light emitting element 30 may have a shape such as a nanorod, a nanowire, or a nanotube. In an embodiment, the light emitting element 30 may have a cylindrical or rod shape. However, the shape of the light emitting element 30 is not limited thereto, and may have various shapes such as a regular cube, a rectangular parallelepiped, and a hexagonal prism.

The structure of the light emitting element 30 is not limited to that illustrated in FIG. 24, and the light emitting element 30 may have other structures.

Figure 25:
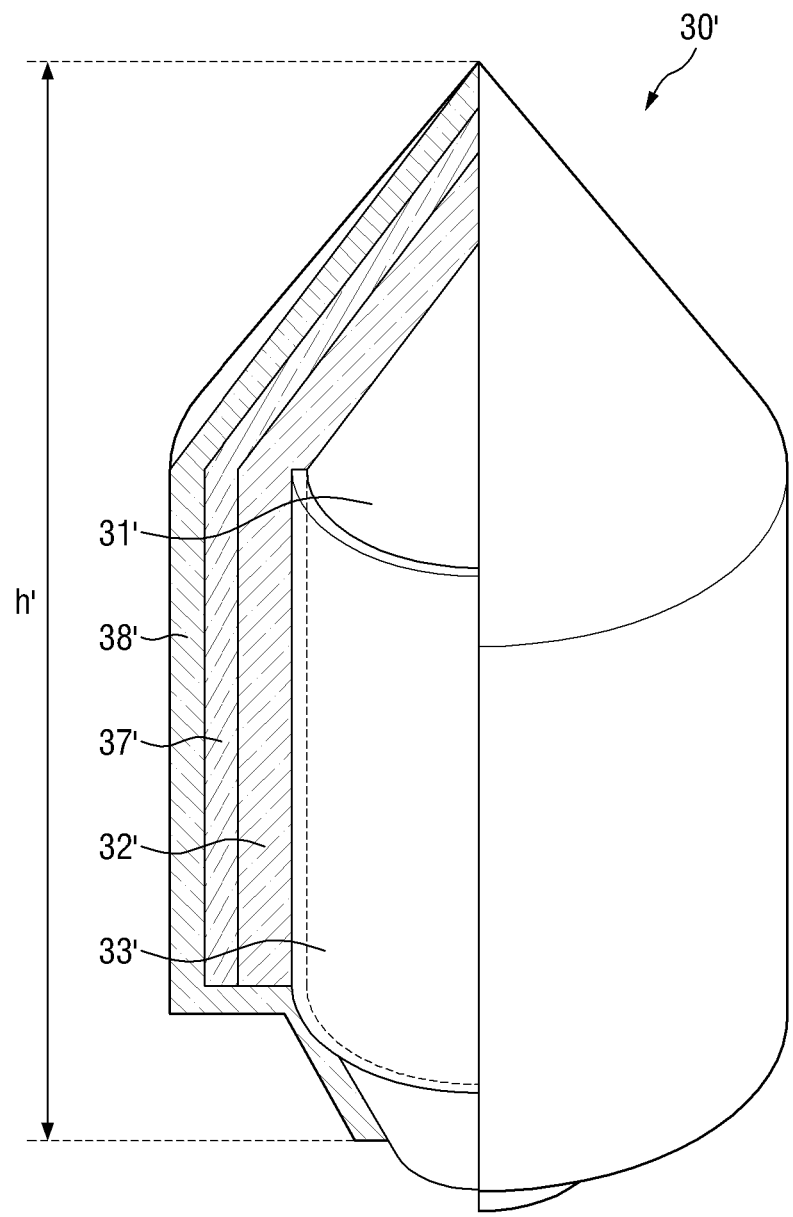
FIG. 25 is a schematic view of a light emitting element according to another embodiment.

FIG. 25 is a schematic view of a light emitting element according to another embodiment.

Referring to FIG. 25, a light emitting element 30' may extend in a direction, and may have a side surface with a partially inclined shape. For example, the light emitting element 30' according to an embodiment may have a partially conical shape.

The light emitting element 30' may be formed such that layers are not stacked in a direction, and each layer surrounds the outer surface of any other layer. The light emitting element 30' of FIG. 25 may be formed such that semiconductor layers surround at least a part of the outer surface of any other layer. The light emitting element 30 may include at least some regions of a semiconductor core extending in a direction and an insulating film 38' formed to surround the semiconductor core. The semiconductor core may include a first semiconductor layer 31', an active layer 33', a second semiconductor layer 32', and an electrode layer 37'. The light emitting element 30' of FIG. 25 is the same as the light emitting element 30 of FIG. 24 except that the shape of each of the layers is partially different. Hereinafter, the same contents will be omitted and differences will be described.

According to an embodiment, the first semiconductor layer 31' may be formed to extend in a direction and to have both ends inclined toward the center thereof. The first semiconductor layer 31' of FIG. 25 may include a body portion having a rod shape or a cylindrical shape, and end portions whose side surfaces have inclined shapes, which are formed above or below the body portion, respectively. The upper end portion of the body portion may have a steeper inclination than the lower end portion.

The active layer 33' is disposed to surround the outer surface of the body portion of the first semiconductor layer 31'. The active layer 33' may have an annular shape extending in a direction. The active layer 33' may not be formed on the upper end portion and the lower end portion of the first semiconductor layer 31'. The active layer 33' may be formed only on the non-inclined side surface of the first semiconductor layer 31'. However, the disclosure is not limited thereto. Accordingly, light emitted from the active layer 33' may be emitted not only from both ends of the light emitting element 30' in a longitudinal direction, but also from both side surfaces of the light emitting element 30' with respect to the longitudinal direction. Compared to the light emitting element 30 of FIG. 24, the light emitting element 30' of FIG. 25 has a larger area of the active layer 33' such that a larger amount of light may be emitted.

The second semiconductor layer 32' is disposed to surround the outer surface of the active layer 33' and the upper end portion of the first semiconductor layer 31'. The second semiconductor layer 32' may include an annular body portion extending in a direction and an upper end portion having an inclined side surface. For example, the second semiconductor layer 32' may directly contact the parallel side surface of the active layer 33' and the inclined upper end portion of the first semiconductor layer 31'. However, the second semiconductor layer 32' is not formed on the lower end portion of the first semiconductor layer 31'.

The electrode layer 37' is disposed to surround the outer surface of the second semiconductor layer 32'. For example, the electrode layer 37' and the second semiconductor layer 32' may be substantially a same shape. For example, the electrode layer 37' may entirely contact the outer surface of the second semiconductor layer 32'.

The insulating film 38' may be disposed to surround outer surfaces of the electrode layer 37' and the first semiconductor layer 31'. The insulating film 38' may directly contact the electrode layer 37', the lower end portion of the first semiconductor layer 31', and the exposed lower end portions of the active layer 33' and the second semiconductor layer 32'.

According to an embodiment, the inkjet printing device 1000 may disperse the light emitting elements 30 and 30' of FIG. 24 or 25 in the ink 90 to be sprayed or ejected onto the target substrate SUB, thereby manufacturing the display device 10 including the light emitting elements 30 and 30'.

Figure 26:
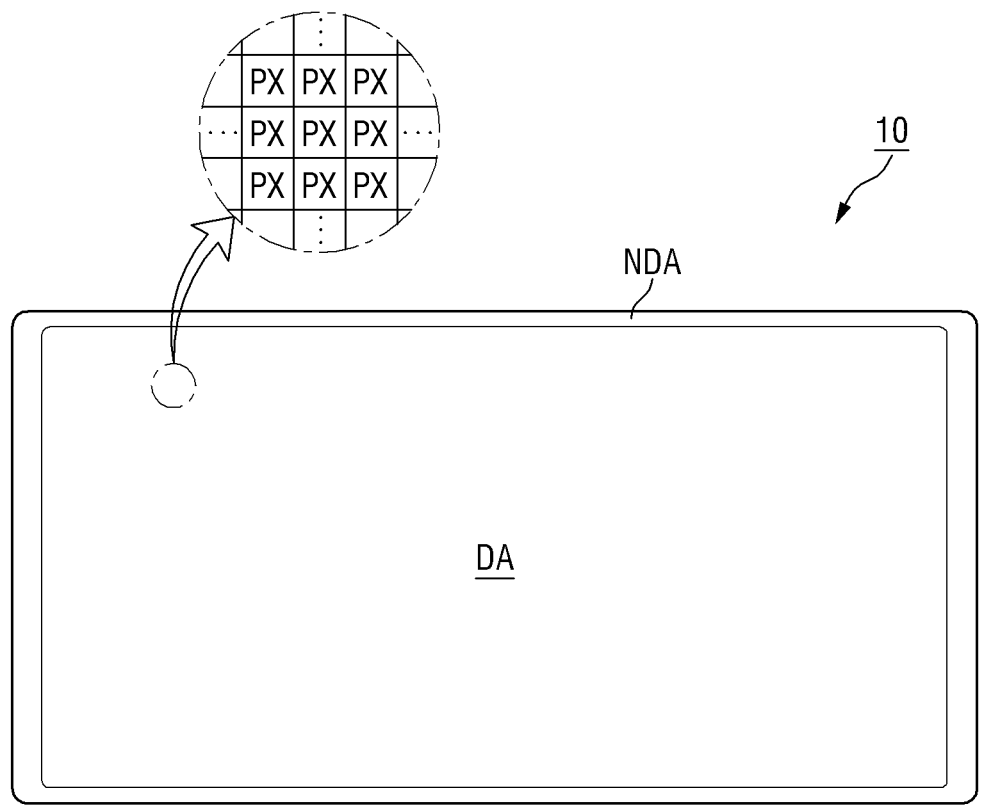
FIG. 26 is a schematic plan view of a display device according to an embodiment.

FIG. 26 is a schematic plan view of a display device according to an embodiment.

Referring to FIG. 26, a display device 10 displays a moving image or a still image. The display device 10 may refer to any electronic device providing a display screen. Examples of the display device 10 may include a television, a laptop computer, a monitor, a billboard, an Internet of things (IoT) device, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation device, a game machine, a digital camera, a camcorder and the like, which provide a display screen.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DA of the display device 10 may also be similar to the overall shape of the display device 10. FIG. 26 illustrates the display device 10 and the display area DA having a rectangular shape elongated in a horizontal direction.

The display device 10 may include a display area DA and a non-display area NDA. The display area DA is an area where an image can be displayed, and the non-display area NDA is an area where an image is not displayed. The display area DA may also be referred to as an active region, and the non-display area NDA may also be referred to as a non-active region.

The display area DA may substantially occupy the center of the display device 10. The display area DA may include pixels PX. The pixels PX may be arranged in a matrix. The shape of each pixel PX may be a rectangular or square shape in a plan view. However, the disclosure is not limited thereto, and it may be a rhombic shape in which each side is inclined with respect to a direction. Each of the pixels PX may include one or more light emitting elements 30 that emit light of a specific wavelength band to display a specific color.

Figure 27:
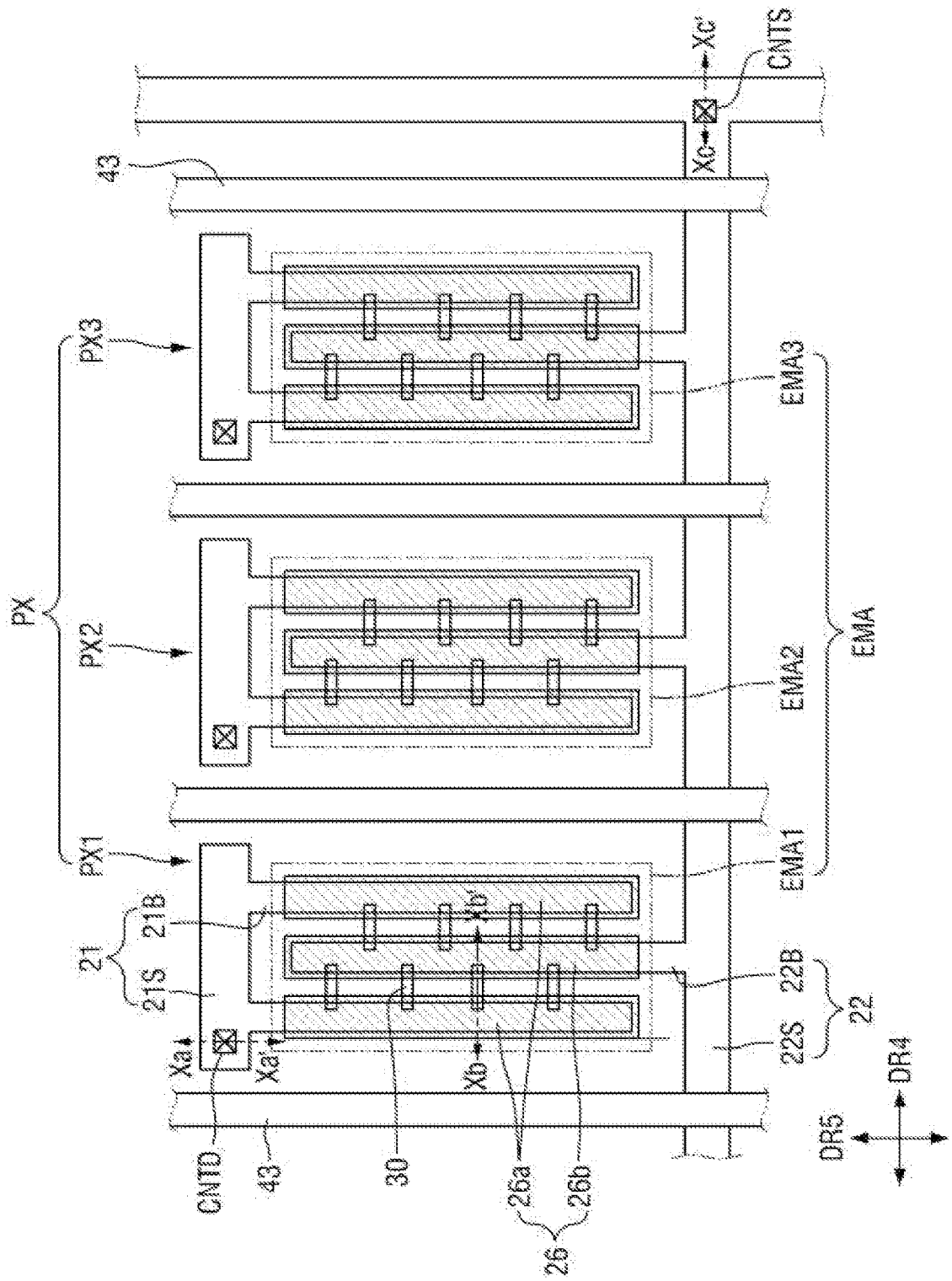
FIG. 27 is a schematic plan view of a pixel of a display device according to an embodiment.

FIG. 27 is a schematic plan view of a pixel of a display device according to an embodiment.

Referring to FIG. 27, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red, but is not limited thereto, and each sub-pixel PXn may emit light of a same color, where n is a natural number. Although FIG. 27 illustrates that the pixel PX includes three sub-pixels PXn, the disclosure is not limited thereto, and the pixel PX may include a larger number of sub-pixels PXn.

Each sub-pixel PXn of the display device 10 may include a region defined as an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as a region where the light emitting elements 30 included in the display device 10 are disposed to emit light of a specific wavelength band.

Although not illustrated in the drawing, each sub-pixel PXn of the display device 10 may include a non-emission area defined as a region other than the emission area EMA. The non-emission area may be a region in which the light emitting element 30 is not disposed and a region from which light is not emitted because light emitted from the light emitting element 30 does not reach it.

Each sub-pixel PXn of the display device 10 includes a light emitting layer EML. The light emitting layer EML may include electrodes 21 and 22, the light emitting element 30, contact electrodes 26, internal banks 41 and 42 (see FIG. 28), an external bank 43, and at least one of insulating layers 51, 52, 53, and 55 (see FIG. 28).

The electrodes 21 and 22 may be electrically connected to the light emitting elements 30 and may be applied with a predetermined voltage such that the light emitting element 30 emits light in a specific wavelength band. At least a part of each of the electrodes 21 and 22 may be utilized to form an electric field in the sub-pixel PXn to align the light emitting element 30.

The electrodes 21 and 22 may include a first electrode 21 and a second electrode 22. In an embodiment, the first electrode 21 may be a separate pixel electrode for each sub-pixel PXn, and the second electrode 22 may be a common electrode commonly connected along each sub-pixel PXn. One of the first electrode 21 and the second electrode 22 may be an anode electrode of the light emitting element 30, and the other one may be a cathode electrode of the light emitting element 30. However, the disclosure is not limited thereto, and an opposite case may also be possible.

The first electrode 21 and the second electrode 22 may include respective electrode stems 21S and 22S disposed to extend in a fourth direction DR4, and at least one respective electrode branches 21B and 22B extending in a fifth direction DR5, which is a direction intersecting the fourth direction DR4, from the electrode stems 21S and 22S, and respectively branched from the electrode stems 21S and 22S.

The first electrode 21 may include a first electrode stem 21S disposed to extend in the fourth direction DR4, and at least one first electrode branch 21B branched from the first electrode stem 21S and extending in the fifth direction DR5.

Both ends of the first electrode stem 21S of any pixel may be terminated with gaps between the respective sub-pixels PXn, and the first electrode stem 21S may be placed on substantially the same straight line as (or colinear with) the first electrode stem 21S of a neighboring sub-pixel in a same row (for example, adjacent in the fourth direction DR4). Since the first electrode stems 21S disposed in the respective sub-pixels PXn are arranged such that both ends thereof are spaced apart from each other, it may be possible to apply different electric signals to the first electrode branches 21B, so that the first electrode branches 21B may be driven individually.

The first electrode branch 21B may be branched from at least a part of the first electrode stem 21S and be disposed to extend in the fifth direction DR5, and may be terminated while being spaced apart from a second electrode stem 22S disposed to face the first electrode stem 21S.

The second electrode 22 may include the second electrode stem 22S extending in the fourth direction DR4 and spaced apart from the first electrode stem 21S in the fifth direction DR5 to face the first electrode stem 21S, and a second electrode branch 22B branched from the second electrode stem 22S and extending in the fifth direction DR5. The other end (or second end) of the second electrode stem 22S may be connected to the second electrode stem 22S of another sub-pixel PXn adjacent to the sub-pixel PXn in the fourth direction DR4. For example, unlike the first electrode stem 21S, the second electrode stem 22S may extend in the fourth direction DR4 and may be disposed to cross each sub-pixel PXn. The second electrode stem 22S intersecting each sub-pixel PXn may be connected to a portion extending in a direction in the non-display area NDA, or to an outer part of the display area DA where the respective pixels PX or sub-pixels PXn are placed.

The second electrode branch 22B may be spaced apart from and face the first electrode branch 21B, and may be terminated while being spaced apart from the first electrode stem 21S. The second electrode branch 22B may be connected to the second electrode stem 22S, and an end of the second electrode branch 22B in which extends in a direction may be disposed in the sub-pixel PXn while being spaced apart from the first electrode stem 21S.

The first electrode 21 and the second electrode 22 may be electrically connected to a circuit element layer (not shown) of the display device 10 through a contact hole, for example, a first electrode contact hole CNTD and a second electrode contact hole CNTS, respectively. The drawing illustrates that the first electrode contact hole CNTD is formed in each of the first electrode stems 21S of each sub-pixel PXn, and only a second electrode contact hole CNTS is formed in a second electrode stem 22S that crosses each sub-pixel PXn. However, the disclosure is not limited thereto, and in some embodiments, even the second electrode contact hole CNTS may be formed in each sub-pixel PXn.

The banks 41, 42, and 43 may include an external bank 43 disposed at a boundary between the respective sub-pixels PXn, and the internal banks 41 and 42 adjacent to the center of each sub-pixel PXn and disposed below each of the electrodes 21 and 22. Although internal banks 41 and 42 are not illustrated in the drawing, a first internal bank 41 and a second internal bank 42 may be disposed below the first electrode branch 21B and the second electrode branch 22B, respectively.

The external bank 43 may be disposed at a boundary between the respective sub-pixels PXn. The first electrode stems 21S may be terminated such that their respective ends are spaced apart from each other with the external banks 430 therebetween. The external bank 43 may extend in the fifth direction DR5 and may be disposed at a boundary between the sub-pixels PXn arranged in the fourth direction DR4. However, the disclosure is not limited thereto, and the external bank 43 may extend in the fourth direction DR4 and may also be disposed at a boundary between the sub-pixels PXn arranged in the fifth direction DR5. The external bank 43 and the internal banks 41 and 42 may include a same material and be formed simultaneously by a process.

The light emitting element 30 may be disposed between the first electrode 21 and the second electrode 22. The light emitting element 30 may have the first end electrically connected to the first electrode 21 and the other end electrically connected to the second electrode 22. The light emitting element 30 may be electrically connected to each of the first electrode 21 and the second electrode 22 through the contact electrode 26 to be described below.

The light emitting elements 30 may be disposed to be spaced apart from each other and may be aligned substantially parallel to each other. The distance between the light emitting elements 30 is not particularly limited. In some embodiments, the light emitting elements 30 may be disposed adjacent to each other to form a group, and other light emitting elements 30 may be grouped while being spaced apart from each other by a predetermined interval, and may have non-uniform density but be aligned by being oriented in a direction. Further, in an embodiment, the light emitting element 30 may extend in a direction, and the extension direction of the electrodes, for example, the first electrode branch 21B and the second electrode branch 22B, may be substantially perpendicular to the extension direction of the light emitting element 30. However, the disclosure is not limited thereto, and the light emitting element 30 may be disposed diagonally with respect to the extension direction of the first electrode branch 21B and the second electrode branch 22B without being perpendicular thereto.

The light emitting elements 30 according to an embodiment may have the active layers 30 including different materials, and thus may emit light of different wavelength bands to the outside. In the display device 10, the light emitting element 30 of the first sub-pixel PX1 may emit first light having a central wavelength band of a first wavelength, the light emitting element 30 of the second sub-pixel PX2 may emit second light having a central wavelength band of a second wavelength, and the light emitting element 30 of the third sub-pixel PX3 may emit third light a central wavelength band of a third wavelength. Accordingly, the first light may be emitted from the first sub-pixel PX1, the second light may be emitted from the second sub-pixel PX2, and the third light may be emitted from the third sub-pixel PX3. In some embodiments, the first light may be blue light having a central wavelength band having a range of about 450 nm to about 495 nm, the second light may be green light having a central wavelength band having a range of about 495 nm to about 570 nm, and the third light may be red light having a central wavelength band having a range of about 620 nm to about 750 nm. However, the disclosure is not limited thereto.

Although not illustrated in FIG. 27, the display device 10 may include a second insulating layer 52 covering at least a part of the first electrode 21 and the second electrode 22.

The second insulating layer 52 may be disposed in each sub-pixel PXn of the display device 10. The second insulating layer 52 may be disposed to substantially entirely cover each sub-pixel PXn, and may also be disposed to extend to other adjacent sub-pixels PXn. The second insulating layer 52 may be disposed to cover at least a part of the first electrode 21 and the second electrode 22. Although not illustrated in FIG. 27, the second insulating layer 52 may be disposed to expose a part of the first electrode 21 and the second electrode 22, specifically, some regions of the first electrode branch 21B and the second electrode branch 22B.

The contact electrodes 26 may have at least some portions extending in a direction. The contact electrodes 26 may contact the light emitting element 30 and the electrodes 21 and 22, respectively, and the light emitting elements 30 may receive electrical signals from the first electrode 21 and the second electrode 22 through the contact electrode 26.

The contact electrode 26 may include a first contact electrode 26a and a second contact electrode 26b. The first contact electrode 26a and the second contact electrode 26b may be disposed on the first electrode branch 21B and the second electrode branch 22B, respectively.

The first contact electrode 26a may be disposed on the first electrode 21 or the first electrode branch 21B to extend in the fifth direction DR5. The first contact electrode 26a may contact the first end of the light emitting element 30. The first contact electrode 26a may contact the exposed first electrode 21 without being disposed on the second insulating layer 52. Accordingly, the light emitting element 30 may be electrically connected to the first electrode 21 through the first contact electrode 26a.

The second contact electrode 26b may be disposed on the second electrode 22 or the second electrode branch 22B to extend in the fifth direction DR5. The second contact electrode 26b may be spaced apart from the first contact electrode 26a in the fourth direction DR4. The second contact electrode 26b may contact the second end of the light emitting element 30. The second contact electrode 26b may contact the exposed second electrode 22 without being disposed on the second insulating layer 52. Accordingly, the light emitting element 30 may be electrically connected to the second electrode 22 through the second contact electrode 26b. Although it is illustrated that two first contact electrodes 26a and a second contact electrode 26b are disposed in a sub-pixel PXn, the disclosure is not limited thereto. The numbers of the first contact electrodes 26a and the second contact electrodes 26b may be changed according to the numbers of the first electrode 21 and the second electrode 22 disposed in each sub-pixel PXn, or the number of the first electrode branches 21B and the second electrode branches 22B.

In some embodiments, the widths of the first contact electrode 26a and the second contact electrode 26b measured in a direction may be larger than the widths of the first electrode 21 and the second electrode 22, or the first electrode branch 21B and the second electrode branch 22B measured in the direction, respectively. However, the disclosure is not limited thereto, and in some embodiments, the first contact electrode 26a and the second contact electrode 26b may be disposed to cover only side portions of the first electrode branch 21B and the second electrode branch 22B.

The display device 10, in addition to the second insulating layer 52, may include a circuit element layer (not shown) positioned below each of the electrodes 21 and 22, the third insulating layer 53 (see FIG. 28) disposed to cover at least a portion of each of the electrodes 21 and 22 and the light emitting element 30, and a passivation layer 55 (see FIG. 28). Hereinafter, the structure of the display device 10 will be described in detail with reference to FIG. 28.

Figure 28:
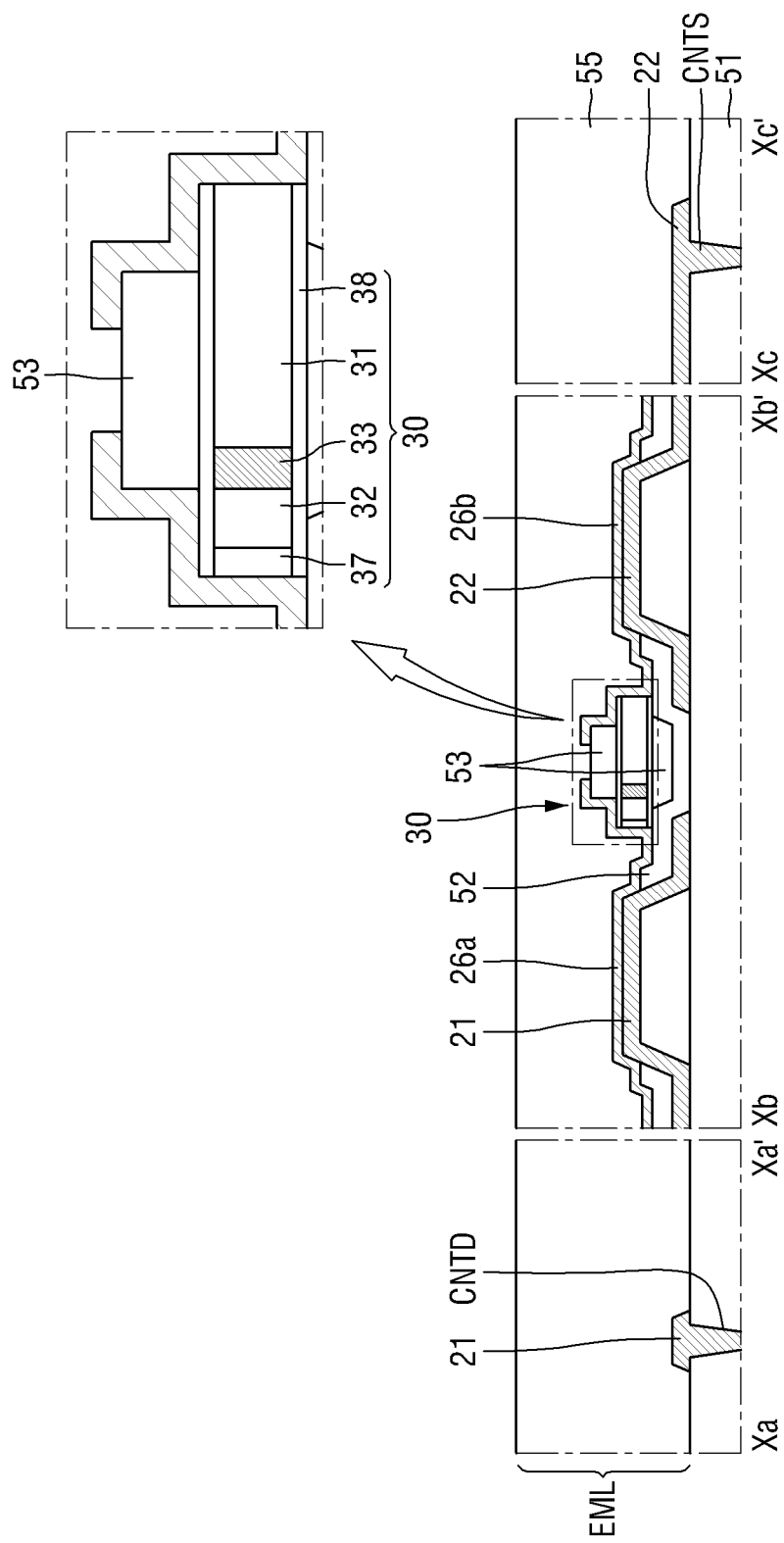
FIG. 28 is a schematic cross-sectional view taken along lines Xa-Xa', Xb-Xb', and Xc-Xc' of FIG. 27.

FIG. 28 is a schematic cross-sectional view taken along lines Xa-Xa', Xb-Xb', and Xc-Xc' of FIG. 27.

FIG. 28 illustrates only a cross section of the first sub-pixel PX1, but the same may also be applied to other pixels PX or sub-pixels PXn. FIG. 28 illustrates a cross section intersecting one end and the other end of the light emitting element 30 disposed in the first sub-pixel PX1.

Although not illustrated in FIG. 28, the display device 10 may further include a circuit element layer positioned below each of the electrodes 21 and 22. The circuit element layer may include semiconductor layers and conductive patterns and may include at least one transistor and a power wire. However, a detailed description thereof will be omitted below.

Referring to FIG. 28 in conjunction with FIG. 27, the display device 10 may include the first insulating layer 51, and the electrodes 21 and 22, the light emitting element 30, and the like disposed on the first insulating layer 51. A circuit element layer (not shown) may be further disposed below the first insulating layer 51. The first insulating layer 51 may include an organic insulating material to perform a surface planarization function.

The banks 41, 42, and 43, the electrodes 21 and 22, and the light emitting element 30 may be disposed on the first insulating layer 51.

The banks 41, 42, and 43 may include the internal banks 41 and 42 disposed in each sub-pixel PXn to be spaced apart from each other, and the external bank 43 disposed at a boundary of the neighboring sub-pixel PXn.

The external bank 43 may extend in the fifth direction DR5 and may be disposed at a boundary between the sub-pixels PXn arranged in the fourth direction DR4. However, the disclosure is not limited thereto, and the external bank 43 may extend in the fourth direction DR4 and may also be disposed at a boundary between the sub-pixels PXn arranged in the fifth direction DR5. For example, the external bank 43 may delimit a boundary of each sub-pixel PXn.

At the time of manufacturing the display device 10, in case that the ink in which the light emitting elements 30 are dispersed is sprayed using the inkjet printing device 1000 of FIG. 1 described above, the external bank 43 may perform a function of preventing the ink from intersecting the boundary of the sub-pixel PXn. In order not to mix the inks with each other in which the different light emitting elements 30 are dispersed for each of different sub-pixels PXn, the external bank 43 may separate the inks from each other. However, the disclosure is not limited thereto.

The internal banks 41 and 42 may include the first internal bank 41 and the second internal bank 42 that are disposed adjacent to the center of each sub-pixel PXn.

The first internal bank 41 and the second internal bank 42 are spaced apart from each other and be disposed to face each other. The first electrode 21 may be disposed on the first internal bank 41, and the second electrode 22 may be disposed on the second internal bank 42. Referring to FIGS. 27 and 28, it may be understood that the first electrode branch 21B is disposed on the first internal bank 41, and the second electrode branch 22B is disposed on the second internal bank 42.

The first internal bank 41 and the second internal bank 42 may be disposed to extend in the fifth direction DR5 in each sub-pixel PXn. However, the disclosure is not limited thereto, and the first internal bank 41 and the second internal bank 42 may be disposed for each sub-pixel PXn to form a pattern on the front surface of the display device 10. The banks 41, 42, and 43 may include polyimide (PI), but the disclosure is not limited thereto.

The first internal bank 41 and the second internal bank 42 may have a structure in which at least a part thereof protrudes with respect to the first insulating layer 51. The first internal bank 41 and the second internal bank 42 may protrude upward beyond a plane on which the light emitting element 30 is disposed, and at least a part of the protruding portion may have an inclination. Since the internal banks 41 and 42 protrude with respect to the first insulating layer 51 and have inclined side surfaces, the light emitted from the light emitting element 30 may be reflected from the inclined side surface of the internal banks 41 and 42. As will be described below, in case that the electrodes 21 and 22 disposed on the internal banks 41 and 42 include a material having high reflectivity, light emitted from the light emitting element 30 may be reflected by the electrodes 21 and 22 and may proceed in an upward direction of the first insulating layer 51.

As described above, the banks 41, 42, and 43 may include a same material and may be formed by a same process. However, the external bank 43 is disposed at a boundary of each sub-pixel PXn to form a grid pattern, but the internal banks 41 and 42 are disposed within each sub-pixel PXn to have a shape extending in a direction.

The electrodes 21 and 22 may be disposed on the first insulating layer 51 and the internal banks 41 and 42. As described above, each of the electrodes 21 and 22 includes the electrode stems 21S and 22S and the electrode branches 21B and 22B.

Portions of the first electrode 21 and the second electrode 22 may be disposed on the first insulating layer 51, and portions thereof may be disposed on the first internal bank 41 and the second internal bank 42. As described above, the first electrode stem 21S of the first electrode 21 and the second electrode stem 22S of the second electrode 22 may extend in the fourth direction DR4, and the first internal bank 41 and the second internal bank 42 may extend in the fifth direction DR5 and may also be disposed in the sub-pixel PXn adjacent in the fifth direction DR5.

The first electrode contact hole CNTD penetrating the first insulating layer 51 and exposing a part of the circuit element layer may be formed in the first electrode stem 21S of the first electrode 21. The first electrode 21 may be electrically connected to a transistor of the circuit element layer through the first electrode contact hole CNTD. The first electrode 21 may receive a predetermined electrical signal from the transistor.

The second electrode stem 22S of the second electrode 22 may extend in a direction to be disposed also in a non-emission area where the light emitting elements 30 are not disposed. The second electrode contact hole CNTS penetrating the first insulating layer 51 and exposing a part of the circuit element layer may be formed in the second electrode stem 22S. The second electrode 22 may be electrically connected to a power electrode through the second electrode contact hole CNTS. The second electrode 22 may receive a predetermined electrical signal from the power electrode.

Some regions of the first electrode 21 and the second electrode 22, for example, the first electrode branch 21B and the second electrode branch 22B may be disposed on the first internal bank 41 and the second internal bank 42, respectively. The light emitting elements 30 may be disposed in a region between the first electrode 21 and the second electrode 22, for example, in a space where the first electrode branch 21B and the second electrode branch 22B are spaced apart and face each other.

Each of the electrodes 21 and 22 may include a transparent conductive material. For example, each of the electrodes 21 and 22 may include a material such as indium tin oxide (ITO), indium zinc oxide (IZO), and indium tin zinc oxide (ITZO), but the disclosure is not limited thereto. In some embodiments, each of the electrodes 21 and 22 may include a conductive material having high reflectivity. For example, each of the electrodes 21 and 22 may include, as a material having high reflectivity, metal such as silver (Ag), copper (Cu), or aluminum (Al). In this case, light incident on each of the electrodes 21 and 22 may be reflected and emitted in an upward direction of each sub-pixel PXn.

Further, each of the electrodes 21 and 22 may have a structure in which at least one transparent conductive material and at least one metal layer having high reflectivity are stacked, or may be formed as a layer including them. In an embodiment, each of the electrodes 21 and 22 may have a stacked structure of ITO/silver (Ag)/ITO/IZO, or may be an alloy including aluminum (Al), nickel (Ni), lanthanum (La), or the like. However, the disclosure is not limited thereto.

The second insulating layer 52 is disposed on the first insulating layer 51, the first electrode 21, and the second electrode 22. The second insulating layer 52 is disposed to partially cover the first electrode 21 and the second electrode 22. The second insulating layer 52 may be arranged to cover (or overlap) most of the top surfaces of the first and second electrodes 21 and 22 and partially expose the first and second electrodes 21 and 22. The second insulating layer 52 may be disposed to expose a part of the top surfaces of the first electrode 21 and the second electrode 22, for example, a part of the top surface of the first electrode branch 21B disposed on the first internal bank 41 and a part of the top surface of the second electrode branch 22B disposed on the second internal bank 42. For example, the second insulating layer 52 may be formed substantially entirely on the first insulating layer 51, and may include an opening partially exposing the first electrode 21 and the second electrode 22.

In an embodiment, the second insulating layer 52 may be formed to have a step between the first electrode 21 and the second electrode 22 such that a portion of the top surface thereof is recessed between the first electrode 21 and the second electrode 22. In some embodiments, the second insulating layer 52 may include an inorganic insulating material, and a portion of the top surface of the second insulating layer 52 disposed to cover the first electrode 21 and the second electrode 22 may be recessed due to a step of a member disposed therebelow. The light emitting element 30 disposed on the second insulating layer 52 between the first electrode 21 and the second electrode 22 may form an empty space with respect to the recessed top surface of the second insulating layer 52. The light emitting element 30 may be disposed to be partially spaced apart from the top surface of the second insulating layer 52, and the space may be filled with a material forming the third insulating layer 53 to be described below. However, the disclosure is not limited thereto. The second insulating layer 52 may form a flat top surface such that the light emitting element 30 is disposed thereon.

The second insulating layer 52 may protect the first electrode 21 and the second electrode 22 while insulating them from each other. Further, it is possible to prevent the light emitting element 30 disposed on the second insulating layer 52 from being damaged by direct contact with other members. However, the shape and structure of the second insulating layer 52 are not limited thereto.

The light emitting element 30 may be disposed on the second insulating layer 52 between the electrodes 21 and 22. For example, at least one light emitting element 30 may be disposed on the second insulating layer 52 disposed between the respective electrode branches 21B and 22B. However, the disclosure is not limited thereto, and although not illustrated in the drawings, at least some of the light emitting elements 30 disposed in each sub-pixel PXn may be disposed in a region other than the region between the respective electrode branches 21B and 22B. The light emitting element 30 may be disposed on each of the ends, which face each other, of the first electrode branch 21B and the second electrode branch 22B, and may be electrically connected to each of the electrodes 21 and 22 through the contact electrode 26.

In the light emitting element 30, layers may be disposed in a horizontal direction with respect to the first insulating layer 51. The light emitting element 30 of the display device 10 according to an embodiment may extend in a direction and may have a structure in which semiconductor layers are sequentially arranged in a direction. As described above, in the light emitting element 30, the first semiconductor layer 31, the active layer 33, the second semiconductor layer 32, and the electrode layer 37 may be sequentially disposed in a direction, and the insulating film 38 may surround the outer surfaces thereof. The light emitting element 30 disposed in the display device 10 may be disposed such that a direction in which the light emitting element 30 extends is parallel to the first insulating layer 51, and the semiconductor layers included in the light emitting element 30 may be sequentially disposed in a direction parallel to the top surface of the first insulating layer 51. However, the disclosure is not limited thereto. In some embodiments, in case that the light emitting element 30 has a different structure, the layers may be disposed in a direction perpendicular to the first insulating layer 51.

One end of the light emitting element 30 may contact the first contact electrode 26a, and the other end thereof may contact the second contact electrode 26b. According to an embodiment, since the light emitting element 30 has an end surface on which the insulating film 38 is not formed in the direction in which the light emitting element 30 extends, and which is exposed, the light emitting element 30 may contact the first contact electrode 26a and the second contact electrode 26b that will be described below, in an exposed region of the light emitting element 30. However, the disclosure is not limited thereto. In some embodiments, in the light emitting element 30, at least some regions of the insulating film 38 may be removed, and the insulating film 38 may be removed to partially expose both end side surfaces of the light emitting element 30.

The third insulating layer 53 may be partially disposed on the light emitting element 30 disposed between the first electrode 21 and the second electrode 22. The third insulating layer 53 may be disposed to partially surround the outer surface of the light emitting element 30. The third insulating layer 53 may function to protect the light emitting element 30 and also fix the light emitting element 30 in a manufacturing process of the display device 10. Further, in an embodiment, a portion of the material of the third insulating layer 53 may be disposed between the bottom surface of the light emitting element 30 and the second insulating layer 52. As described above, the third insulating layer 53 may be formed to fill a space between the second insulating layer 52 and the light emitting element 30 formed during the manufacturing process of the display device 10. Accordingly, the third insulating layer 53 may be formed to surround the outer surface of the light emitting element 30. However, the disclosure is not limited thereto.

The third insulating layer 53 may be disposed between the first electrode branch 21B and the second electrode branch 22B to extend in the fifth direction DR5 in a plan view. For example, the third insulating layer 53 may have an island shape or a linear shape on the first insulating layer 51 in a plan view. According to an embodiment, the third insulating layer 53 may be disposed above the light emitting element 30.

The first contact electrode 26a and the second contact electrode 26b are disposed on the electrodes 21 and 22, respectively, and on the third insulating layer 53. The first contact electrode 26a and the second contact electrode 26b may be disposed on the third insulating layer 53 to be spaced apart from each other. The third insulating layer 53 may insulate the first contact electrode 26a and the second contact electrode 26b from each other such that they do not directly contact each other.

The first contact electrode 26a may contact the exposed regions of the first electrode 21 on the first internal bank 41, and the second contact electrode 26b may contact the exposed regions of the second electrode 22 on the second internal bank 42. The first contact electrode 26a and the second contact electrode 26b may transmit electrical signals transmitted from the respective electrodes 21 and 22 to the light emitting element 30.

The contact electrode 26 may include a conductive material. For example, it may include ITO, IZO, ITZO, aluminum (Al), or the like. However, the disclosure is not limited thereto.

The passivation layer 55 may be disposed on the contact electrode 26 and the third insulating layer 53. The passivation layer 55 may function to protect members disposed on the first insulating layer 51 from external environment.

Each of the second insulating layer 52, the third insulating layer 53, and the passivation layer 55 described above may include an inorganic insulating material or an organic insulating material. In an embodiment, the second insulating layer 52, the third insulating layer 53, and the passivation layer 55 may include an inorganic insulating material such as silicon oxide ($SiO_x$), silicon nitride ($SiN_x$), silicon oxynitride ($SiO_xN_y$), aluminum oxide ($Al_2O_3$), and aluminum nitride (AlN). The second insulating layer 52, the third insulating layer 53, and the passivation layer 55 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethylmethacrylate, polycarbonate, and polymethylmethacrylate-polycarbonate synthetic resin. However, the disclosure is not limited thereto.

Figure 29:
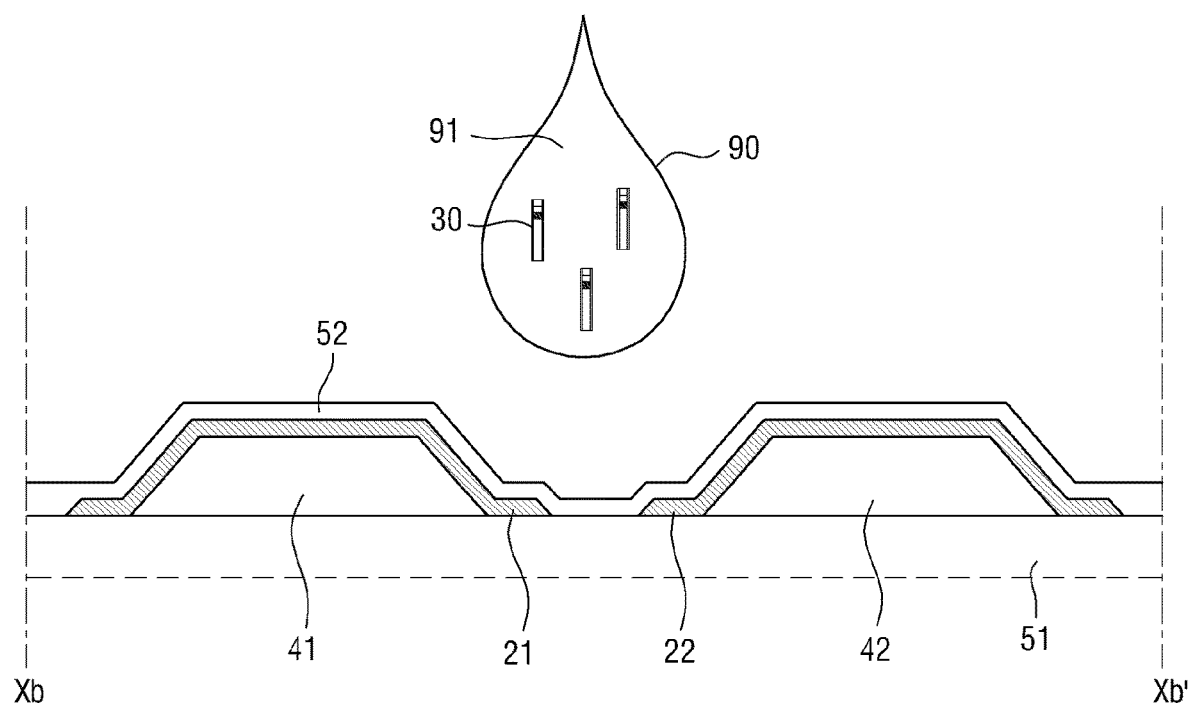
FIGS. 29 to 31 are schematic cross-sectional views partially illustrating a method for manufacturing a display device according to an embodiment.
Figure 30:
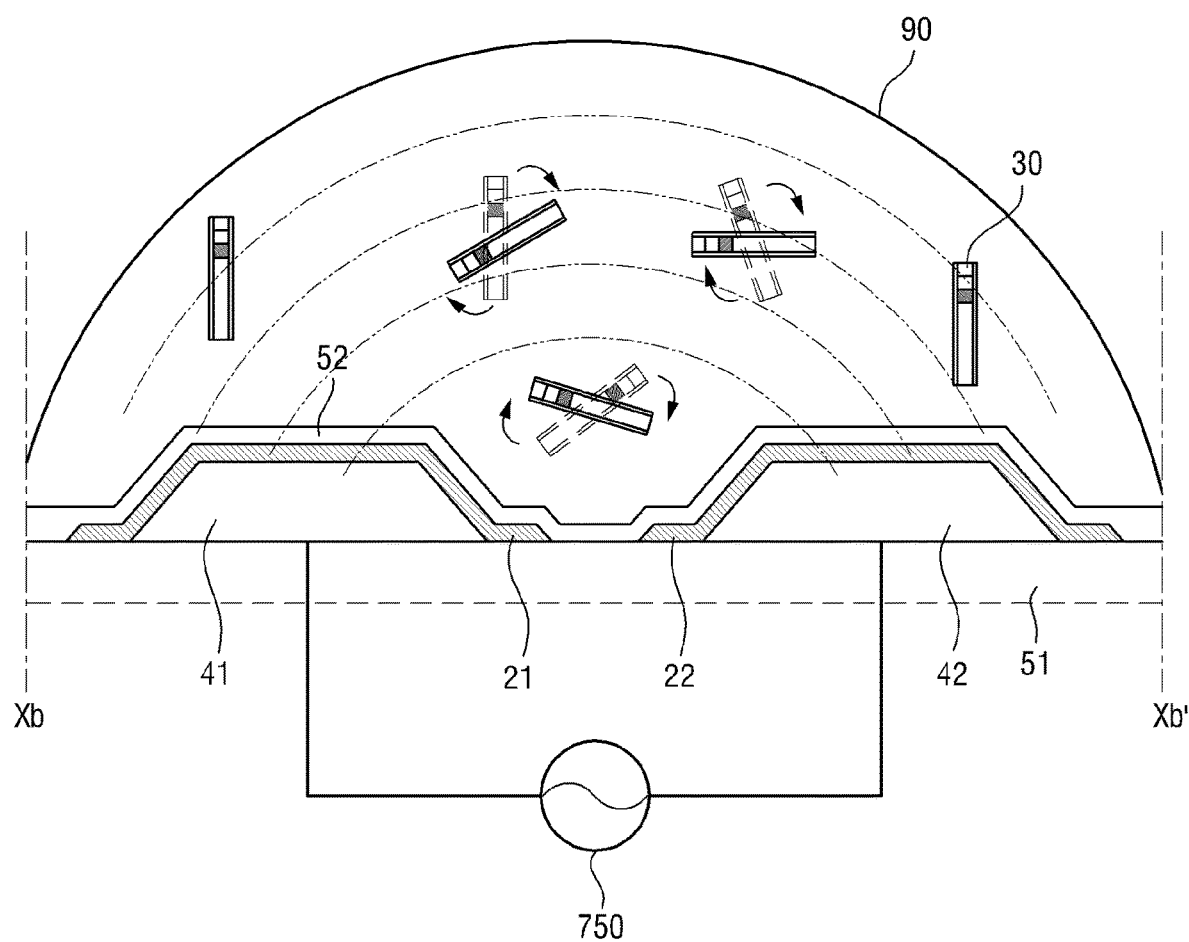
Figure 31:
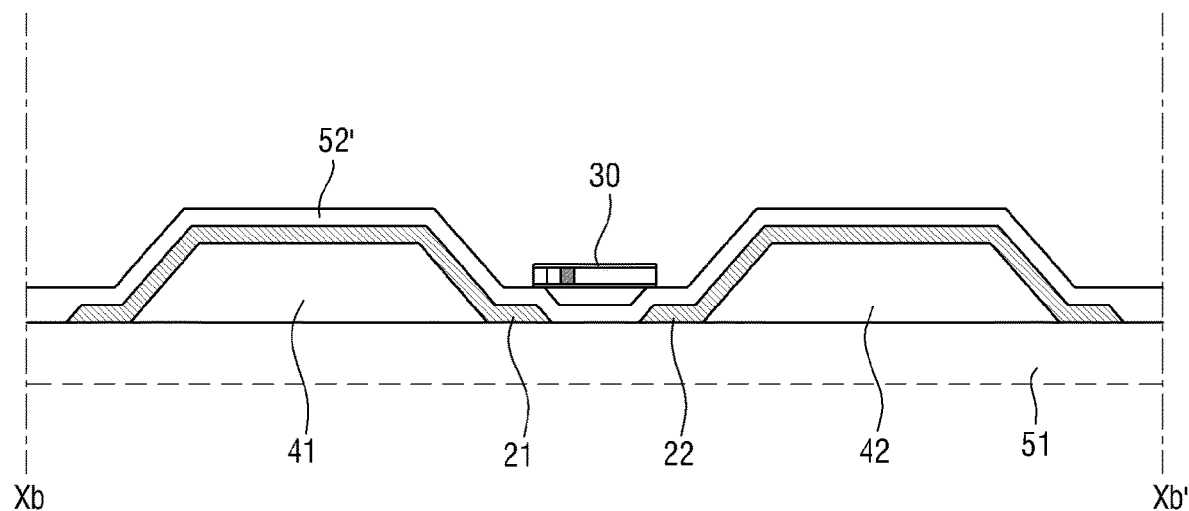

FIGS. 29 to 31 are schematic cross-sectional views partially illustrating a method for manufacturing a display device according to an embodiment.

Referring to FIGS. 29 to 31, the display device 10 according to an embodiment may be manufactured using the inkjet printing device 1000 described above with reference to FIG. 1. The inkjet printing device 1000 may spray the ink 90 in which the light emitting elements 30 are dispersed, and the light emitting element 30 may be disposed between the first electrode 21 and the second electrode 22 of the display device 10.

First, as illustrated in FIG. 29, the first insulating layer 51, the first internal bank 41 and the second internal bank 42 disposed on the first insulating layer 51 to be spaced apart from each other, the first electrode 21 and the second electrode 22 disposed on the first internal bank 41 and the second internal bank 42, respectively, and a second insulating material layer 52' covering (or overlapping) the first electrode 21 and the second electrode 22, are prepared. The second insulating material layer 52' may be partially patterned in a subsequent process to form the second insulating layer 52 of the display device 10. The members may be formed by patterning a metal, an inorganic material, an organic material, or the like by performing a conventional mask process.

Next, the ink 90 in which the light emitting elements 30 are dispersed is sprayed on the first electrode 21 and the second electrode 22. The light emitting element 30 is a type of bipolar element, and the ink 90 in which the light emitting elements 30 are dispersed may be sprayed using the inkjet printing device 1000 and the bipolar element alignment method described above. As illustrated in the drawing, in the ink 90 sprayed by the inkjet printing device 1000 according to an embodiment, the light emitting elements 30 extending in a direction may be dispersed, and the light emitting elements 30 may be sprayed in a state in which one direction of extension (in which the light emitting elements 30 extend) is perpendicular to the top surface of the first insulating layer 51. A description thereof is the same as that described above, and thus a detailed description thereof will be omitted.

Next, as illustrated in FIG. 30, an electrical signal is applied to the first electrode 21 and the second electrode 22 to generate the electric field IEL in the ink 90 in which the light emitting elements 30 are dispersed. The light emitting element 30 may receive a dielectrophoretic force by the electric field IEL and may be placed between the first electrode 21 and the second electrode 22 while the orientation direction and position thereof are changed.

Next, as illustrated in FIG. 31, the solvent 91 of the ink 90 is removed. By the above process, the light emitting element 30 may be disposed between the first electrode 21 and the second electrode 22. Although not illustrated in the drawings, the second insulating material layer 52' may be patterned to form the second insulating layer 52, and the third insulating layer 53, the first contact electrode 26a and the second contact electrode 26b, and the passivation layer 55 may be formed to manufacture the display device 10.

According to the method for manufacturing the display device 10 using the inkjet printing device 1000 according to an embodiment, the light emitting element 30 may be aligned between the first electrode 21 and the second electrode 22 with a high alignment degree. The light emitting element 30 with an improved alignment degree may reduce poor connection or contact between the respective electrodes 21 and 22 or the contact electrodes 26a and 26b, and may improve the emission reliability for each pixel PX of the display device 10.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. An inkjet printing device comprising:
   an electric field generation part including:
      a stage; and
      a probe part generating an electric field on the stage; and
   an inkjet head positioned above the stage and including nozzles from which ink is ejected, wherein
   each of the nozzles includes:
      an inlet having a first diameter; and
      an outlet connected to the inlet and having a second diameter smaller than the first diameter, and
   the inkjet printing device ejects the ink including a bipolar element extending in an extension direction, the bipolar element comprising a semiconductor.

2. The inkjet printing device of claim 1, wherein each of the nozzles includes:
   a first side surface which is a side surface of the outlet, extends in a first direction, and
   a second side surface, which is an internal side surface of the inlet farthest away from the outlet, is inclined with respect to the first direction.

3. The inkjet printing device of claim 2, wherein
   the ink is introduced into the outlet through the inlet, and
   the bipolar element is introduced into the outlet along the second side surface of each of the nozzles.

4. The inkjet printing device of claim 3, wherein the bipolar element is ejected from the outlet in a state in which the extension direction of the bipolar elements is parallel to the first direction.

5. The inkjet printing device of claim 2, wherein
   the inkjet head further includes a guide part positioned between the nozzles, and
   the guide part includes:
      a first guide part between the outlets; and
      a second guide part between the inlets.

6. The inkjet printing device of claim 5, wherein the inkjet head further includes an electric field generation electrode disposed in the guide part.

7. The inkjet printing device of claim 6, wherein the electric field generation electrode includes:
   a first electric field generation electrode disposed on a surface of the first guide part contacting the first side surface; and
   a second electric field generation electrode disposed on a surface of the second guide part contacting the second side surface and spaced apart from the first electric field generation electrode in the first direction.

8. The inkjet printing device of claim 7, wherein the first electric field generation electrode and the second electric field generation electrode generate an electric field in the first direction at the inlet and the outlet.

9. The inkjet printing device of claim 5, wherein the inkjet head further includes an electric field generation coil disposed to surround the nozzles.

10. The inkjet printing device of claim 9, wherein the electric field generation coil generates an electric field in the first direction at the inlet and the outlet.

11. The inkjet printing device of claim 2, wherein
the inkjet head further includes an inner tube connected to the inlet, and
the first diameter of the inlet decreases from the inner tube to the outlet.

12. The inkjet printing device of claim 11, wherein
the inkjet head further includes a plurality of third guide parts disposed between the inlet and the inner tube, and
each of the nozzles further includes an inlet tube formed by a separation space between the third guide parts between the inner tube and the inlet.

13. The inkjet printing device of claim 12, wherein
the ink is supplied from the inner tube to the inlet along the inlet tube, and
the bipolar element is introduced to the second side surface along a side surface of the inlet tube.

14. The inkjet printing device of claim 1, wherein
the inkjet head is disposed on a print head part mounted on a support extending in a direction, and
the print head part moves in the direction.

15. The inkjet printing device of claim 2, wherein
the ejected ink is sprayed onto the stage, and
the electric field generation part generates an electric field on the stage.

16. The inkjet printing device of claim 15, wherein
the bipolar element comprises a light emitting element having one of a cylindrical and a rod shape, and
the bipolar element sprayed onto the stage is aligned by the electric field such that the extension direction of the bipolar element faces a second direction different from the first direction.

17. A method for aligning a bipolar element, comprising:
spraying ink including a bipolar element oriented in an extension direction onto a target substrate, the bipolar element comprising a semiconductor; and
generating an electric field above the target substrate to place the bipolar element on the target substrate wherein
the electric field is generated using electrodes disposed above the target substrate and spaced apart from the target substrate, and
the electric field affects an orientation of the bipolar element.

18. The method of claim 17, wherein
the bipolar element has a shape extending in the extension direction of the bipolar element, and
the spraying of the ink is performed in a state in which the electric field causes an orientation direction of a long axis of the bipolar element to be perpendicular to a top surface of the target substrate.

19. The method of claim 18, wherein the spraying of the ink comprises generating an electric field in a nozzle such that the long axis of the bipolar element is oriented in a direction that the electric field faces.

20. The method of claim 19, wherein the ink is sprayed in a state in which the electric field causes an end of the bipolar element is oriented toward the top surface of the target substrate.

21. The method of claim 17, wherein
the target substrate includes a first electrode and a second electrode, and
the placing of the bipolar element comprises placing the bipolar element between the first electrode and the second electrode.

22. The method of claim 21, wherein at least one end of the bipolar element is disposed on at least one of the first electrode or the second electrode.

23. The method of claim 17, wherein the spraying of the ink onto the target substrate is performed using an inkjet printing device.

24. The method of claim 23, wherein
the inkjet printing device includes an electric field generation part including:
a stage; and
a probe part generating an electric field on the stage; and
an inkjet head positioned above the stage and including nozzles from which the ink is ejected, and
each of the nozzles includes:
an inlet having a first width; and
an outlet connected to the inlet and having a second width smaller than the first width.

25. A method for manufacturing a display device, comprising:
preparing a target substrate on which a first electrode and a second electrode are formed;
spraying ink including a light emitting element oriented in a direction onto the target substrate, wherein the light emitting element has a shape extending in an extension direction, and wherein the spraying of the ink comprises generating an electric field in a nozzle such that a long axis of the light emitting element is oriented in a direction that the electric field faces; and
placing the light emitting element between the first electrode and the second electrode.

26. The method of claim 25, wherein
the spraying of the ink is performed in a state in which the electric field causes an orientation direction of a long axis of the light emitting element to be perpendicular to a top surface of the target substrate.

27. The method of claim 26, wherein
the placing of the light emitting element further comprises generating another electric field on the first electrode and the second electrode, and
the method further includes aligning the orientation direction of the long axis of the light emitting element by the another electric field.

* * * * *